United States Patent
Stachowiak et al.

(10) Patent No.: US 10,317,793 B2
(45) Date of Patent: Jun. 11, 2019

(54) SUBSTRATE PRETREATMENT COMPOSITIONS FOR NANOIMPRINT LITHOGRAPHY

(71) Applicant: Canon Kabushiki Kaisha, Tokyo (JP)

(72) Inventors: Timothy Brian Stachowiak, Austin, TX (US); Weijun Liu, Cedar Park, TX (US); Fen Wan, Austin, TX (US)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 15/449,395

(22) Filed: Mar. 3, 2017

(65) Prior Publication Data

US 2018/0252999 A1 Sep. 6, 2018

(51) Int. Cl.
| | |
|---|---|
| *G03F 7/00* | (2006.01) |
| *G03F 7/16* | (2006.01) |
| *H01L 21/027* | (2006.01) |

(52) U.S. Cl.
CPC .............. *G03F 7/0002* (2013.01); *G03F 7/16* (2013.01); *H01L 21/0271* (2013.01)

(58) Field of Classification Search
CPC ............ G03F 7/0002; G03F 7/16; G03F 7/70; H01L 21/0271
USPC .......................... 438/763; 427/282; 428/172
See application file for complete search history.

(56) References Cited

U.S. PATENT DOCUMENTS

| | | |
|---|---|---|
| 4,720,578 A | 1/1988 | Liu |
| 5,294,511 A | 3/1994 | Aoai |
| 5,296,330 A | 3/1994 | Schulz |
| 5,360,692 A | 11/1994 | Kawabe |
| 5,391,587 A | 2/1995 | Wu |
| 5,405,720 A | 4/1995 | Hosaka |
| 5,436,098 A | 7/1995 | Schulz |

(Continued)

FOREIGN PATENT DOCUMENTS

| | | |
|---|---|---|
| EP | 1212195 A1 | 6/2002 |
| EP | 1808447 | 9/2010 |

(Continued)

OTHER PUBLICATIONS

Notice of the Reason for Refusal for JP Patent Application No. 2016-154767, dated Sep. 27, 2016, 9 pages.

(Continued)

*Primary Examiner* — Didarul A Mazumder
(74) *Attorney, Agent, or Firm* — Fish & Richardson P.C.

(57) ABSTRACT

A nanoimprint lithography method includes coating a surface of a nanoimprint lithography substrate with a pretreatment composition to yield a layer of the pretreatment composition on the surface of the substrate, disposing an imprint resist on the layer of the pretreatment composition to yield a composite layer on the surface of the substrate, contacting the composite layer with a nanoimprint lithography template, and forming a polymeric layer on the surface of the substrate by polymerizing the composite layer. The pretreatment composition includes a polymerizable component having a molecular mass between about 300 and about 750. The imprint resist is a polymerizable composition. The composite layer includes a mixture of the pretreatment composition and the imprint resist. An average spreading rate of the imprint resist to form the composite layer exceeds an average spreading rate of the imprint resist on the substrate under otherwise identical conditions.

20 Claims, 23 Drawing Sheets

(56) References Cited

U.S. PATENT DOCUMENTS

| | | |
|---|---|---|
| 5,529,881 A | 6/1996 | Kawabe |
| 5,576,143 A | 11/1996 | Aoai |
| 5,824,451 A | 10/1998 | Aoai |
| 6,334,960 B1 | 1/2002 | Willson et al. |
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,157,036 B2 | 1/2007 | Choi et al. |
| 7,197,396 B2 | 3/2007 | Stopczynski |
| 7,365,103 B2 | 4/2008 | Willson et al. |
| 7,396,475 B2 | 7/2008 | Sreenivasan |
| 7,704,643 B2 | 4/2010 | Cole et al. |
| 7,759,407 B2 | 7/2010 | Xu |
| 7,837,921 B2 | 11/2010 | Xu et al. |
| 7,939,131 B2 | 5/2011 | Xu et al. |
| 8,025,833 B2 | 9/2011 | Kodama et al. |
| 8,076,386 B2 | 12/2011 | Xu et al. |
| 8,202,468 B2 | 6/2012 | Zhu et al. |
| 8,288,079 B2 | 10/2012 | Ogino et al. |
| 8,349,241 B2 | 1/2013 | Sreenivasan et al. |
| 8,361,546 B2 | 1/2013 | Fletcher et al. |
| 8,530,540 B2 | 9/2013 | Kodama |
| 8,557,351 B2 | 10/2013 | Xu |
| 8,637,587 B2 | 1/2014 | Xu et al. |
| 8,808,808 B2 | 8/2014 | Xu et al. |
| 8,846,195 B2 | 9/2014 | Xu et al. |
| 9,263,289 B2 | 2/2016 | Hattori et al. |
| 2004/0065252 A1 | 4/2004 | Sreenivasan et al. |
| 2004/0211754 A1 | 10/2004 | Sreenivasan |
| 2004/0256764 A1 | 12/2004 | Choi et al. |
| 2005/0112503 A1 | 5/2005 | Kanda et al. |
| 2007/0018362 A1* | 1/2007 | Heidari .............. B82Y 10/00 264/496 |
| 2007/0212494 A1 | 9/2007 | Xu |
| 2008/0000373 A1 | 1/2008 | Petrucci et al. |
| 2008/0000871 A1 | 1/2008 | Suh et al. |
| 2008/0055581 A1 | 3/2008 | Rogers et al. |
| 2008/0199816 A1 | 8/2008 | Choi et al. |
| 2008/0308971 A1 | 12/2008 | Liu et al. |
| 2009/0053535 A1* | 2/2009 | Xu .................... B82Y 10/00 428/446 |
| 2009/0085255 A1* | 4/2009 | Tada .................. B82Y 10/00 264/401 |
| 2009/0148619 A1 | 6/2009 | LaBrake et al. |
| 2009/0171127 A1 | 7/2009 | Murata et al. |
| 2010/0098940 A1* | 4/2010 | Liu .................... B82Y 10/00 428/336 |
| 2010/0099837 A1 | 4/2010 | Murphy et al. |
| 2010/0104852 A1* | 4/2010 | Fletcher ............. B82Y 10/00 428/315.5 |
| 2010/0155988 A1 | 6/2010 | Keil et al. |
| 2010/0230385 A1 | 9/2010 | Colburn et al. |
| 2010/0276059 A1 | 11/2010 | Tian et al. |
| 2011/0031651 A1 | 2/2011 | Xu et al. |
| 2011/0129424 A1 | 6/2011 | Berkland et al. |
| 2011/0195276 A1* | 8/2011 | Hu .................... B82Y 10/00 428/833.5 |
| 2012/0021180 A1 | 1/2012 | Miyake et al. |
| 2012/0225263 A1 | 9/2012 | Kodama |
| 2013/0120485 A1 | 5/2013 | Kodama et al. |
| 2013/0172476 A1 | 7/2013 | Sasamoto et al. |
| 2013/0213930 A1* | 8/2013 | Wakamatsu ........ B82Y 10/00 216/41 |
| 2014/0034229 A1 | 2/2014 | Xu |
| 2014/0050900 A1* | 2/2014 | Kodama ............. B82Y 10/00 428/195.1 |
| 2014/0349425 A1 | 11/2014 | Lee et al. |
| 2015/0017329 A1 | 1/2015 | Fletcher et al. |
| 2015/0140227 A1 | 5/2015 | Lida et al. |
| 2015/0218394 A1* | 8/2015 | Kim .................... H01L 51/0004 428/195.1 |
| 2015/0228498 A1 | 8/2015 | Hattori |
| 2016/0215074 A1* | 7/2016 | Honma .............. G03F 7/0002 |
| 2016/0291463 A1 | 10/2016 | Miyazawa |
| 2016/0306276 A1* | 10/2016 | Konno ............... G03F 7/0002 |
| 2016/0363858 A1 | 12/2016 | Shimatani |
| 2017/0066208 A1 | 3/2017 | Khusnatdinov et al. |
| 2017/0068159 A1* | 3/2017 | Khusnatdinov ....... G03F 7/0002 |
| 2017/0068161 A1 | 3/2017 | Stachowiak et al. |
| 2017/0282440 A1 | 10/2017 | Stachowiak et al. |
| 2017/0283620 A1 | 10/2017 | Otani et al. |
| 2017/0283632 A1 | 10/2017 | Chiba et al. |
| 2017/0285462 A1 | 10/2017 | Ito |
| 2017/0285463 A1 | 10/2017 | Ito et al. |
| 2017/0285464 A1 | 10/2017 | Ito et al. |
| 2017/0285465 A1 | 10/2017 | Iimura et al. |
| 2017/0285466 A1 | 10/2017 | Chiba et al. |
| 2017/0285479 A1 | 10/2017 | Stachowiak et al. |
| 2017/0287708 A1 | 10/2017 | Liu et al. |
| 2017/0371240 A1 | 12/2017 | Liu et al. |
| 2018/0253000 A1 | 9/2018 | Saito et al. |

FOREIGN PATENT DOCUMENTS

| | | |
|---|---|---|
| EP | 2827361 | 1/2015 |
| JP | 2007055235 | 3/2007 |
| JP | 2009503139 | 1/2009 |
| JP | 2009051017 | 3/2009 |
| JP | 2009208409 A1 | 9/2009 |
| JP | 2010214859 | 9/2010 |
| JP | 2010530641 | 9/2010 |
| JP | 2011508680 | 3/2011 |
| JP | 2011071299 | 4/2011 |
| JP | 2011096766 | 5/2011 |
| JP | 4929722 | 2/2012 |
| JP | 5463170 | 1/2014 |
| JP | 5483083 | 2/2014 |
| JP | 5498729 | 3/2014 |
| JP | 5511415 | 4/2014 |
| JP | 2014093385 | 5/2014 |
| JP | 5596367 | 8/2014 |
| JP | 5599648 | 8/2014 |
| JP | 2015070145 | 4/2015 |
| WO | WO2008156750 A1 | 12/2008 |
| WO | WO2011126131 | 10/2011 |
| WO | WO2011155602 | 12/2011 |
| WO | WO2012133955 | 10/2012 |
| WO | WO2013191228 | 12/2013 |
| WO | WO2015016851 A1 | 2/2015 |
| WO | WO2010021291 | 2/2016 |
| WO | WO2017044421 A1 | 3/2017 |
| WO | WO2017130853 A1 | 8/2017 |
| WO | WO2017175668 A1 | 10/2017 |
| WO | WO2018163995 A1 | 9/2018 |
| WO | WO2018164015 A1 | 9/2018 |
| WO | WO2018164017 A1 | 9/2018 |

OTHER PUBLICATIONS

European Search Report for Application No. 16185680.2, dated Jan. 31, 2017, 10 pages.
International Search Report and Written Opinion for International Application No. PCT/US16/50400, dated Dec. 8, 2016, 10 pages.
Chou et al., Imprint of sub-25 nm vias and trenches in polymers. Applied Physics Letters 67(21):3114-3116, Nov. 20, 1995.
Chou et al., Nanoimprint lithography. Journal of Vacuum Science Technology B 14(6): 4129-4133, Nov./Dec. 1996.
Long et al., Materials for step and flash imprint lithography (S-FIL®). Journal of Materials Chemistry 17(34):3575-3580, Sep. 2007.
Sungjune Jung et al., The impact and spreading of a small liquid drop on a nonporous substrate over an extended time scale. Soft Matter 8(9):2686-2696, Feb. 2012.
Abia B. Afsar-Siddiqui et al., The spreading of surfactant solutions on thin liquid films. Adv. Colloid Interface Sci. 106:183-236, Dec. 2003.
M. Lenz et al., Surfactant Driven Flow of Thin Liquid Films, Universitat Bonn, 2002.
D. P. Gaver, III et al., The dynamics of a localized surfactant on a thin film. J. Fluid Mech. 213:127-148, Apr. 1990.

(56) References Cited

OTHER PUBLICATIONS

Dussaud, et al. Spreading characteristics of an insoluble surfactant film on a thin liquid layer: comparison between theory and experiment. J. Fluid Mech. 544:23-51, 2005.
International Search Report and Written Opinion for International Application No. PCT/US2017/024570, dated Jun. 19, 2017, 12 pages.
International Search Report and Written Opinion for International Application No. PCT/US2017/022917, dated Jun. 9, 2017, 9 pages.
International Search Report and Written Opinion for International Application No. PCT/US2017/024493, dated Jun. 27, 2017, 9 pages.
International Search Report and Written Opinion for International Application No. PCT/US2018/017829, dated Mar. 9, 2018, 15 pages.
International Search Report and Written Opinion for International Application No. PCT/US17/39231, dated Sep. 29, 2017, 10 pages.
Surface energy data for (Poly)Benzyl methacrylate, CAS#:25085-83-0 (Year: 2009), 9 pages.
Surface energy data for Polysulfone, CAS#:25135-51-7 (Year: 2009), 1 pages.
Pierre-Gilles de Gennes et al., "Capillarity and Wetting Phenomena-Drops, Bubbles, Pearls, Waves", 2004, Springer-Verlag, in p. 3 (Year: 2004), 1 page.
Supplementary European Search Report for Application No. EP16844935, dated Mar. 20, 2019, 8 pages.

\* cited by examiner

US 10,317,793 B2

SUBSTRATE PRETREATMENT COMPOSITIONS FOR NANOIMPRINT LITHOGRAPHY

TECHNICAL FIELD

This invention relates to facilitating throughput in nanoimprint lithography processes by treating a nanoimprint lithography substrate to promote spreading of an imprint resist on the substrate.

BACKGROUND

As the semiconductor processing industry strives for larger production yields while increasing the number of circuits per unit area, attention has been focused on the continued development of reliable high-resolution patterning techniques. One such technique in use today is commonly referred to as imprint lithography. Imprint lithography processes are described in detail in numerous publications, such as U.S. Patent Application Publication No. 2004/0065252, and U.S. Pat. Nos. 6,936,194 and 8,349,241, all of which are incorporated by reference herein. Other areas of development in which imprint lithography has been employed include biotechnology, optical technology, and mechanical systems.

An imprint lithography technique disclosed in each of the aforementioned patent documents includes formation of a relief pattern in an imprint resist and transferring a pattern corresponding to the relief pattern into an underlying substrate. The patterning process uses a template spaced apart from the substrate and a polymerizable composition (an "imprint resist") disposed between the template and the substrate. In some cases, the imprint resist is disposed on the substrate in the form of discrete, spaced-apart drops. The drops are allowed to spread before the imprint resist is contacted with the template. After the imprint resist is contacted with the template, the resist is allowed to uniformly fill the space between the substrate and the template, then the imprint resist is solidified to form a layer that has a pattern conforming to a shape of the surface of the template. After solidification, the template is separated from the patterned layer such that the template and the substrate are spaced apart.

Throughput in an imprint lithography process generally depends on a variety of factors. When the imprint resist is disposed on the substrate in the form of discrete, spaced-apart drops, throughput depends at least in part on the efficiency and uniformity of spreading of the drops on the substrate. Spreading of the imprint resist may be inhibited by factors such as gas voids between the drops and incomplete wetting of the substrate and/or the template by the drops.

SUMMARY

In a first general aspect, a nanoimprint lithography method includes coating a surface of a nanoimprint lithography substrate with a pretreatment composition to yield a layer of the pretreatment composition on the surface of the nanoimprint lithography substrate, disposing an imprint resist on the layer of the pretreatment composition to yield a composite layer on the surface of the nanoimprint lithography substrate, contacting the composite layer with a nanoimprint lithography template, and forming a polymeric layer on the surface of the nanoimprint lithography substrate by polymerizing the composite layer. The pretreatment composition is a liquid including a polymerizable component having a molecular mass between about 300 and about 750. The imprint resist is a polymerizable composition. The composite layer includes a mixture of the pretreatment composition and the imprint resist, and an average spreading rate of the imprint resist to form the composite layer exceeds an average spreading rate of the imprint resist on the nanoimprint lithography substrate under otherwise identical conditions. Polymerizing the composite layer includes forming a covalent bond between the polymerizable component of the pretreatment composition and a component of the imprint resist.

In a second general aspect, manufacturing an article includes coating a surface of a nanoimprint lithography substrate with a pretreatment composition to yield a layer of the pretreatment composition on the surface of the nanoimprint lithography substrate, disposing an imprint resist on the layer of the pretreatment composition to yield a composite layer on the surface of the nanoimprint lithography substrate, contacting the composite layer with a nanoimprint lithography template, and forming a polymeric layer on the surface of the nanoimprint lithography substrate to yield the article. The pretreatment composition is a liquid including a polymerizable component having a molecular mass between about 300 and about 750. The imprint resist is a polymerizable composition. The composite layer includes a mixture of the pretreatment composition and the imprint resist, and an average spreading rate of the imprint resist to form the composite layer exceeds an average spreading rate of the imprint resist on the nanoimprint lithography substrate under otherwise identical conditions. Forming the polymeric layer includes polymerizing the composite layer, and polymerizing the composite layer includes forming a covalent bond between the polymerizable component of the pretreatment composition and a component of the imprint resist.

In a third general aspect, a kit includes a pretreatment composition and an imprint resist. The pretreatment composition includes a polymerizable component having a molecular mass between about 300 and about 750. The imprint resist is a polymerizable composition, and polymerizing a liquid mixture of the pretreatment composition and the imprint resist forms a covalent bond between the polymerizable component of the pretreatment composition and a component of the imprint resist.

In a fourth general aspect, a method for pretreating a nanoimprint lithography substrate includes coating a nanoimprint lithography substrate with a pretreatment composition. The pretreatment composition includes a polymerizable component having a molecular mass between about 300 and 750 and is free of a polymerization initiator.

Implementations of the first, second, third, and fourth general aspects may include one or more of the following features.

In some embodiments, the pretreatment composition is free or substantially free of a polymerization initiator.

The polymerizable component may include a (meth) acrylate monomer. The methacrylate monomer may include at least one glycol unit. The at least one glycol unit may be an ethylene glycol unit (EO or —$OCH_2CH_2O$—) or a propylene glycol unit (PO or —$OCHCH_3CH_2O$—). The polymerizable component may include at least one of tripropylene glycol diacrylate, tetraethylene glycol diacrylate, poly(ethylene glycol) diacrylate, tricyclodecane dimethanol diacrylate, stearyl acrylate, iso-stearyl acrylate, alkoxylated 1,6-hexanediol diacrylate, phenol tetraethylene glycol acrylate, neopentylglycol dipropylene glycol diacrylate, 1,12-dodecanediol dimethacrylate, 1,3-bis((2-hydroxyethoxy)methyl)benzene diacrylate, 4-hexylresorcinol diacrylate, 1,4-bis((2-hydroxyethoxy)methyl)cyclohexane diacrylate, 1,3-bis((2-hydroxyethoxy)methyl)-cyclohexane diacrylate, 3-benzyloxy-1,2-propanediol (EO)$_n$ diacrylate (n=1-6), 2-phenyl-1,3-propanediol (EO)$_2$ diacrylate, 4-benzyloxy-1,3-butanediol diacrylate, 4-benzyloxy-1,3-butanediol (EO)$_2$ diacrylate, trimethylolpropane trimethacrylate, caprolactone acrylate, pentaerythritol tetraacrylate, alkoxylated pentaerythritol tetraacrylate, alkoxylated nonyl phenol acrylate, methoxy polyethylene glycol mono acrylates, alkoxylated lauryl acrylate, propoxylated (3) glyceryl triacrylate, alkoxylated trimethylolpropane triacrylate, ethoxylated bisphenol A diacrylate, ditrimethylolpropane tetraacrylate, dipentaerythritol pentaacrylate, and dipentaerythritol hexaacrylate. In some embodiments, the polymerizable component includes at least one of 1,3-bis((2-hydroxyethoxy)methyl)benzene diacrylate, 4-hexylresorcinol diacrylate, 3-benzyloxy-1,2-propanediol (EO)$_1$ diacrylate, 2-phenyl-1,3-propanediol (EO)$_2$ diacrylate, 4-benzyloxy-1,3-butanediol diacrylate, and 4-benzyloxy-1,3-butanediol (EO)$_2$ diacrylate.

In some embodiments, an interfacial surface energy between the polymerizable component and air is at least 35 mN/m, at least 36 mN/m, at least at least 37 mN/m, or at least 38 mN/m. In some embodiments, an interfacial surface energy between the polymerizable component and air is 45 mN/m or less. In certain embodiments, the difference between the interfacial surface energy between the pretreatment composition and air and between the imprint resist and air is in a range of 0.5 mN/m to 25 mN/m. In certain embodiments, the interfacial surface energy between the imprint resist and air is in a range of 20 mN/m to 60 mN/m. A viscosity of the pretreatment composition at 25° C. may be less than 150 cP or less than 100 cP.

In implementations of the second general aspect, the article may include a processed nanoimprint lithography substrate or an optical component.

A fifth general aspect includes the article of the second general aspect.

Implementations of the fourth general aspect may include one or more of the following features.

In some embodiments, the fourth general aspect includes disposing an imprint resist on the layer of the pretreatment composition to yield a composite layer on the surface of the nanoimprint lithography substrate. The imprint resist is a polymerizable composition, the composite layer includes a mixture of the pretreatment composition and the imprint resist, and an average spreading rate of the imprint resist to form the composite layer exceeds an average spreading rate of the imprint resist on the nanoimprint lithography substrate under otherwise identical conditions.

In certain embodiments, the fourth general aspect includes contacting the composite layer with a nanoimprint lithography template and forming a polymeric layer on the surface of the nanoimprint lithography substrate by polymerizing the composite layer. Polymerizing the composite layer includes forming a covalent bond between the polymerizable component of the pretreatment composition and a component of the imprint resist.

A sixth general aspect includes a pretreatment composition for a nanoimprint lithography substrate. The pretreatment composition includes at least one of 1,3-bis((2-hydroxyethoxy)methyl)benzene diacrylate, 4-hexylresorcinol diacrylate, 3-benzyloxy-1,2-propanediol (EO)$_1$ diacrylate, 2-phenyl-1,3-propanediol (EO)$_2$ diacrylate, 4-benzyloxy-1,3-butanediol diacrylate, and 4-benzyloxy-1,3-butanediol (EO)$_2$ diacrylate.

The details of one or more implementations of the subject matter described in this specification are set forth in the accompanying drawings and the description below. Other features, aspects, and advantages of the subject matter will become apparent from the description, the drawings, and the claims.

DETAILED DESCRIPTION

Figure 1:
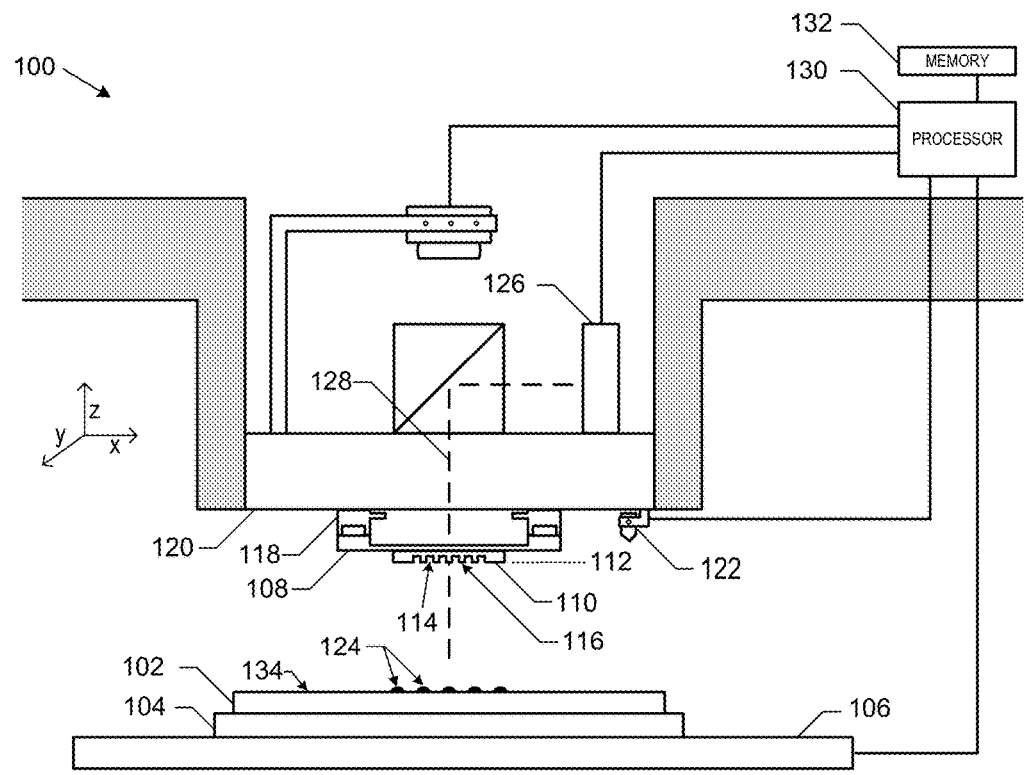
FIG. 1 depicts a simplified side view of a lithographic system.

FIG. 1 depicts an imprint lithographic system 100 of the sort used to form a relief pattern on substrate 102. Substrate 102 may include a base and an adhesion layer adhered to the base. Substrate 102 may be coupled to substrate chuck 104. As illustrated, substrate chuck 104 is a vacuum chuck. Substrate chuck 104, however, may be any chuck including, but not limited to, vacuum, pin-type, groove-type, electromagnetic, and/or the like. Exemplary chucks are described in U.S. Pat. No. 6,873,087, which is incorporated by reference herein. Substrate 102 and substrate chuck 104 may be further supported by stage 106. Stage 106 may provide motion about the x-, y-, and z-axes. Stage 106, substrate 102, and substrate chuck 104 may also be positioned on a base.

Spaced apart from substrate 102 is a template 108. Template 108 generally includes a rectangular or square mesa 110 some distance from the surface of the template towards substrate 102. A surface of mesa 110 may be patterned. In some cases, mesa 110 is referred to as mold 110 or mask 110. Template 108, mold 110, or both may be formed from such materials including, but not limited to, fused silica, quartz, silicon, silicon nitride, organic polymers, siloxane polymers, borosilicate glass, fluorocarbon polymers, metal (e.g., chrome, tantalum), hardened sapphire, or the like, or a combination thereof. As illustrated, patterning of surface 112 includes features defined by a plurality of spaced-apart recesses 114 and protrusions 116, though embodiments are not limited to such configurations. Patterning of surface 112 may define any original pattern that forms the basis of a pattern to be formed on substrate 102.

Template 108 is coupled to chuck 118. Chuck 118 is typically configured as, but not limited to, vacuum, pin-type, groove-type, electromagnetic, or other similar chuck types. Exemplary chucks are further described in U.S. Pat. No. 6,873,087, which is incorporated by reference herein. Further, chuck 118 may be coupled to imprint head 120 such that chuck 118 and/or imprint head 120 may be configured to facilitate movement of template 108.

System 100 may further include a fluid dispense system 122. Fluid dispense system 122 may be used to deposit imprint resist 124 on substrate 102. Imprint resist 124 may be dispensed upon substrate 102 using techniques such as drop dispense, spin-coating, dip coating, chemical vapor deposition (CVD), physical vapor deposition (PVD), thin film deposition, thick film deposition, or the like. In a drop dispense method, imprint resist 124 is disposed on substrate 102 in the form of discrete, spaced-apart drops, as depicted in FIG. 1.

System 100 may further include an energy source 126 coupled to direct energy along path 128. Imprint head 120 and stage 106 may be configured to position template 108 and substrate 102 in superimposition with path 128. System 100 may be regulated by a processor 130 in communication with stage 106, imprint head 120, fluid dispense system 122, and/or source 126, and may operate on a computer readable program stored in memory 132.

Imprint head 120 may apply a force to template 108 such that mold 110 contacts imprint resist 124. After the desired volume is filled with imprint resist 124, source 126 produces energy (e.g., electromagnetic radiation or thermal energy), causing imprint resist 124 to solidify (e.g., polymerize and/or crosslink), conforming to the shape of surface 134 of substrate 102 and patterning surface 112. After solidification of imprint resist 124 to yield a polymeric layer on substrate 102, mold 110 is separated from the polymeric layer.

Figure 2:
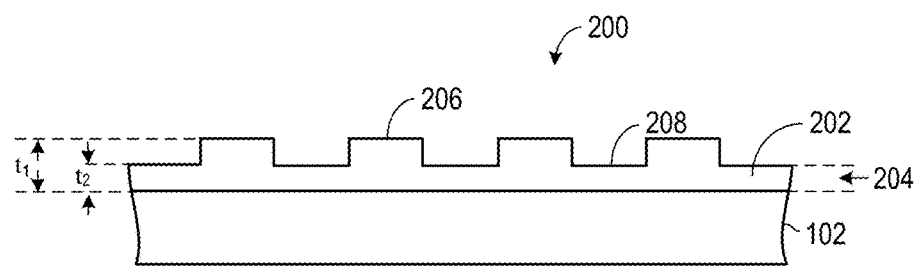
FIG. 2 depicts a simplified side view of the substrate shown in FIG. 1, with a patterned layer formed on the substrate.

FIG. 2 depicts nanoimprint lithography stack 200 formed by solidifying imprint resist 124 to yield patterned polymeric layer 202 on substrate 102. Patterned layer 202 may include a residual layer 204 and a plurality of features shown as protrusions 206 and recesses 208, with protrusions 206 having a thickness $t_1$ and residual layer 204 having a thickness t2. In nanoimprint lithography, a length of one or more protrusions 206, recessions 208, or both parallel to substrate 102 is less than 100 nm, less than 50 nm, or less than 25 nm. In some cases, a length of one or more protrusions 206, recessions 208, or both is between 1 nm and 25 nm or between 1 nm and 10 nm.

The above-described system and process may be further implemented in imprint lithography processes and systems such as those referred to in U.S. Pat. Nos. 6,932,934; 7,077,992; 7,197,396; and 7,396,475, all of which are incorporated by reference herein.

For a drop-on-demand or drop dispense nanoimprint lithography process, in which imprint resist 124 is disposed on substrate 102 as discrete portions ("drops"), as depicted in FIG. 1, the drops of the imprint resist typically spread on the substrate 102 before and after mold 110 contacts the imprint resist. If the spreading of the drops of imprint resist 124 is insufficient to cover substrate 102 or fill recesses 114 of mold 110, polymeric layer 202 may be formed with defects in the form of voids. Thus, a drop-on-demand nanoimprint lithography process typically includes a delay between initiation of dispensation of the drops of imprint resist 124 and initiation of movement of the mold 110 toward the imprint resist on the substrate 102 and subsequent filling of the space between the substrate and the template. As such, throughput of an automated nanoimprint lithography process is generally limited by the rate of spreading of the imprint resist on the substrate and filling of the template. Accordingly, throughput of a drop-on-demand or drop dispense nanoimprint lithography process may be improved by reducing "fill time" (i.e., the time required to completely fill the space between the template and substrate such that voids are not present).

One way to decrease fill time is to increase the rate of spreading of the drops of the imprint resist and coverage of the substrate with the imprint resist before movement of the mold toward the substrate is initiated. Increasing coverage of the substrate reduces the volume of interstitial voids between drops of the imprint resist, thereby reducing the amount of gas trapped in the interstitial voids when the imprint resist is contacted with the mold and reducing the number and severity of defects in the patterned layer resulting therefrom. As described herein, the rate of spreading of an imprint resist and the uniformity of coverage of the substrate may be improved by pretreating the substrate with a liquid that promotes rapid and even spreading of the discrete portions of the imprint resist and polymerizes with the imprint resist during formation of the patterned layer, such that the amount of gas trapped in the interstitial voids when the imprint resist is contacted with the mold and thus the number and severity of defects in the resulting patterned layer are reduced.

Spreading of discrete portions of a second liquid on a first liquid may be understood with reference to FIGS. 3A-3D. FIGS. 3A-3D depict first liquid 300 and second liquid 302 on substrate 304 and in contact with gas 306 (e.g., air, an inert gas such as helium or nitrogen, or a combination of inert gases). First liquid 300 is present on substrate 304 in the form of coating or layer, used here interchangeably. In some cases, first liquid 300 is present as a layer having a thickness of a few nanometers (e.g., between 1 nm and 15 nm, or between 5 nm and 10 nm). Second liquid 302 is present in the form of a discrete portion ("drop"). The properties of first liquid 300 and second liquid 302 may vary with respect to each other. For instance, in some cases, first liquid 300 may be more viscous and dense than second liquid 302.

The interfacial surface energy, or surface tension, between second liquid 302 and first liquid 300 is denoted as $\gamma_{L1L2}$. The interfacial surface energy between first liquid 300 and gas 306 is denoted as $\gamma_{L1G}$. The interfacial surface energy between second liquid 302 and gas 306 is denoted as $\gamma_{L2G}$. The interfacial surface energy between first liquid 300 and substrate 304 is denoted as $\gamma_{SL1}$. The interfacial surface energy between second liquid 302 and substrate 304 is denoted as $\gamma_{SL2}$.

Figure 3A:
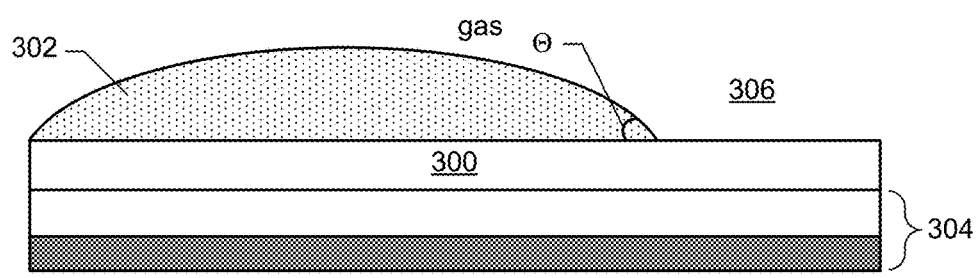
FIGS. 3A-3D depict spreading interactions between a drop of a second liquid on a layer of a first liquid.

FIG. 3A depicts second liquid 302 as a drop disposed on first liquid 300. Second liquid 302 does not deform first liquid 300 and does not touch substrate 304. As depicted, first liquid 300 and second liquid 302 do not intermix, and the interface between the first liquid and the second liquid is depicted as flat. At equilibrium, the contact angle of second liquid 302 on first liquid 300 is $\theta$, which is related to the interfacial surface energies $\gamma_{L1G}$, $\gamma_{L2G}$, and $\gamma_{L1L2}$ by Young's equation:

$$\gamma_{L1G} = \gamma_{L1L2} + \gamma_{L2G} \cdot \cos(\theta) \tag{1}$$

If $$\gamma_{L1G} \geq \gamma_{L1L2} + \gamma_{L2G} \tag{2}$$

then $\theta = 0°$, and second liquid 302 spreads completely on first liquid 300. If the liquids are intermixable, then after some elapsed time, $$\gamma_{L1L2} \tag{3}$$

In this case, the condition for complete spreading of second liquid 302 on first liquid 300 is $$\gamma_{L1G} \geq \gamma_{L2G} \tag{4}$$

For thin films of first liquid 300 and small drops of second liquid 302, intermixing may be limited by diffusion processes. Thus, for second liquid 302 to spread on first liquid 300, the inequality (2) is more applicable in the initial stages of spreading, when second liquid 302 is disposed on first liquid 300 in the form of a drop.

Figure 3B:
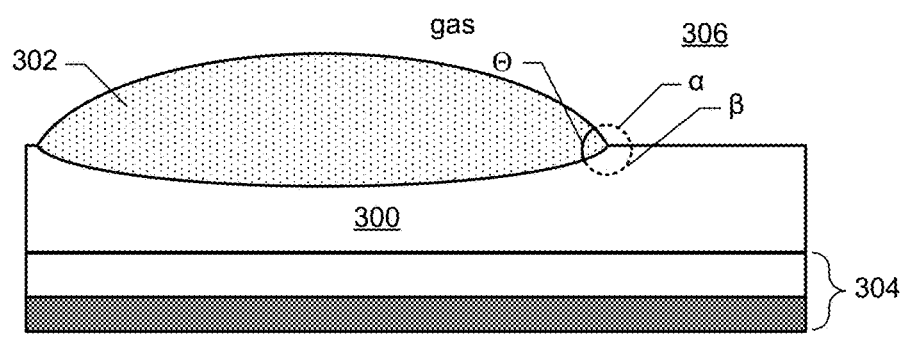

FIG. 3B depicts contact angle formation for a drop of second liquid 302 when the underlying layer of first liquid 300 is thick. In this case, the drop does not touch the substrate 304. Drop of second liquid 302 and layer of first liquid 300 intersect at angles $\alpha$, $\beta$, and $\theta$, with $$\alpha + \beta + \theta = 2\pi \tag{5}$$

There are three conditions for the force balance along each interface:

$$\gamma_{L2G} + \gamma_{L1L2} \cdot \cos(\theta) + \gamma_{L1G} \cdot \cos(\alpha) = 0 \tag{6}$$

$$\gamma_{L2G} \cdot \cos(\theta) + \gamma_{L1L2} + \gamma_{L1G} \cdot \cos(\beta) = 0 \tag{7}$$

$$\gamma_{L2G} \cdot \cos(\alpha) + \gamma_{L1L2} \cdot \cos(\beta) + \gamma_{L1G} = 0 \tag{8}$$

If first liquid 300 and second liquid 302 are intermixable, then $$\gamma_{L1L2} = 0 \tag{9}$$

and equations (6)-(8) become:

$$\gamma_{L2G} + \gamma_{L1G} \cdot \cos(\alpha) = 0 \tag{10}$$

$$\gamma_{L2G} \cdot \cos(\theta) \gamma_{L1G} \cdot \cos(\beta) = 0 \tag{11}$$

$$\gamma_{L2G} \cdot \cos(\alpha) + \gamma_{L1G} = 0 \tag{12}$$

Equations (10) and (12) give $$\cos^2(\alpha) = 1 \tag{13}$$

and $$\alpha = 0, \pi \tag{14}$$

When second liquid 302 wets first liquid 300, $$\alpha = \pi \tag{15}$$

$$\gamma_{L2G} = \gamma_{L1G} \tag{16}$$

and equation (11) gives $$\cos(\theta) + \cos(\beta) = 0 \tag{17}$$

Combining this result with equations (5) and (15) gives:

$$\theta = 0 \tag{18}$$

$$\beta = \pi \tag{19}$$

Thus, equations (15), (18), and ($\theta$) give solutions for angles $\alpha$, $\beta$, and $\theta$.
When $$\gamma_{L1G} \geq \gamma_{L2G} \tag{20}$$

there is no equilibrium between the interfaces. Equation (12) becomes an inequality even for $\alpha = \pi$, and second liquid 302 spreads continuously on first liquid 300.

Figure 3C:
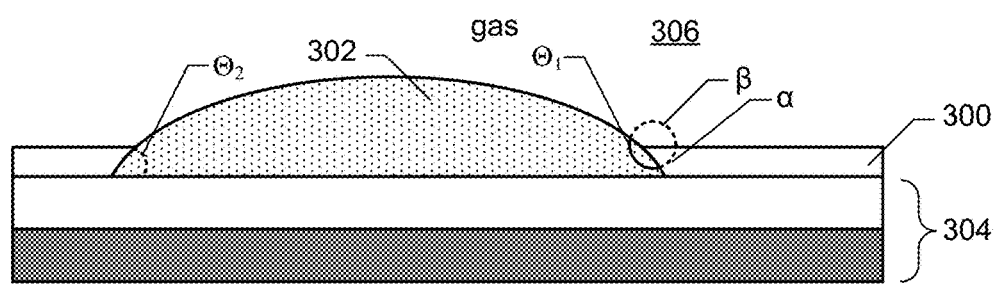

FIG. 3C depicts a more complex geometry for a drop of second liquid 302 touching substrate 304 while also having an interface with first liquid 300. Interfacial regions between first liquid 300, second liquid 302, and gas 306 (defined by angles $\alpha$, $\beta$, and $\theta_1$) and first liquid 300, second liquid 302, and substrate 304 (defined by angle $\theta_2$) must be considered to determine spreading behavior of the second liquid on the first liquid.

The interfacial region between first liquid 300, second liquid 302, and gas 306 is governed by equations (6)-(8). Since first liquid 300 and second liquid 302 are intermixable, $$\gamma_{L1L2} = 0 \tag{21}$$

The solutions for angle $\alpha$ are given by equation (14). In this case, let $$\alpha = 0 \tag{22}$$

and $$\theta_1 = \pi \tag{23}$$

$$\beta = \pi \tag{24}$$

When $$\gamma_{L1G} \geq \gamma_{L2G} \tag{25}$$

there is no equilibrium between the drop of second liquid 302 and first liquid 300, and the drop spreads continuously along the interface between the second liquid and the gas until limited by other physical limitations (e.g., conservation of volume and intermixing).

For the interfacial region between first liquid 300, second liquid 302, and substrate 304, an equation similar to equation (1) should be considered:

$$\gamma_{SL1} = \gamma_{SL2} + \gamma_{L1L2} \cdot \cos(\theta_2) \tag{26}$$

If $$\gamma_{SL1} \geq \gamma_{SL2} + \gamma_{L1L2} \quad (27)$$

the drop spreads completely, and $\theta_2=0$.

Again, as for the intermixable liquids, the second term $\gamma_{L1L2}=0$, and the inequality (27) simplifies to $$\gamma_{SL1} \geq \gamma_{SL2} \quad (28)$$

The combined condition for the drop spreading is expressed as $$\gamma_{L1G} + \gamma_{SL1} \geq \gamma_{L2G} + \gamma_{SL2} \quad (29)$$

when energies before and after the spreading are considered. There should be an energetically favorable transition (i.e., the transition that minimizes the energy of the system).

Different relationships between the four terms in the inequality (29) will determine the drop spreading character. The drop of second liquid 302 can initially spread along the surface of the first liquid 300 if the inequality (25) is valid but the inequality (28) is not. Or the drop can start spreading along liquid-solid interface provided the inequality (28) holds up and the inequality (25) does not. Eventually first liquid 300 and second liquid 302 will intermix, thus introducing more complexity.

Figure 3D:
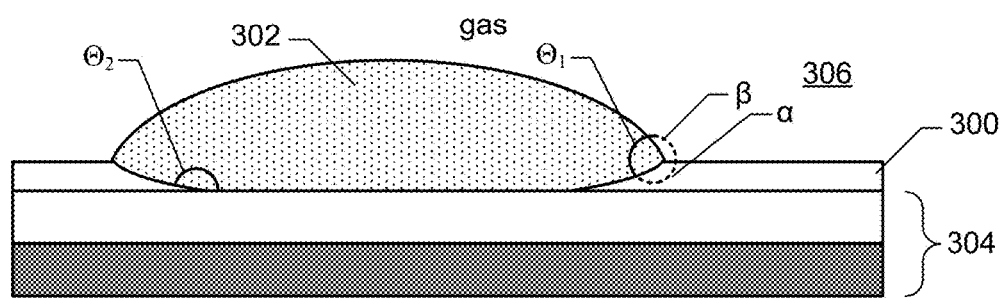

FIG. 3D depicts a geometry for a drop of second liquid 302 touching substrate 304 while having an interface with first liquid 300. As indicated in FIG. 3D, there are two interfacial regions of interest on each side of the drop of second liquid 302. The first interfacial region is where first liquid 300, second liquid 302, and gas 306 meet, indicated by angles $\alpha$, $\beta$, and $\theta_1$. The second interfacial region of interest is where first liquid 300, second liquid 302, and substrate 304 meet, indicated by angle $\theta_2$. Here, $\theta_1$ approaches 0° and $\theta_2$ approaches 180° as the drop spreads when the surface tension of the interface between second liquid 302 and substrate 304 exceeds the surface tension of the interface between first liquid 300 and the substrate ($\gamma_{SL2} \geq \gamma_{SL1}$). That is, drop of second liquid 302 spreads along the interface between first liquid 300 and the second liquid and does not spread along the interface between the second liquid and substrate 304.

For the interface between first liquid 300, second liquid 302, and gas 306, equations (6)-(8) are applicable. First liquid 300 and second liquid 302 are intermixable, so $$\gamma_{L1L2}=0 \quad (30)$$

The solutions for angle $\alpha$ are given by equation (14). For $$\alpha=\pi \quad (31)$$

Equation (11) gives $$\cos(\theta_1)+\cos(\beta)=0 \quad (32)$$

and $$\theta_1=0 \quad (33)$$

$$\beta=\pi \quad (34)$$

When $$\gamma_{L1G} \geq \gamma_{L2G} \quad (35)$$

there is no equilibrium between the drop of second liquid 302 and liquid 300, and the drop spreads continuously along the interface between the second liquid and the gas until limited by other physical limitations (e.g., conservation of volume and intermixing).

For the interfacial region between second liquid 302 and substrate 304, $$\gamma_{SL_1} = \gamma_{SL_2} + \gamma_{L_1L_2} \cdot \cos(\theta_2) \quad (36)$$

$$\cos(\theta_2) = \frac{\gamma_{SL_1} - \gamma_{SL_2}}{\gamma_{L_1L_2}} \quad (37)$$

If $$\gamma_{SL_1} \leq \gamma_{SL_2} \quad (38)$$

and the liquids are intermixable, i.e., $$\gamma_{L1L2} \to 0 \quad (39)$$

$$-\infty \leq \cos(\theta_2) \leq -1 \quad (40)$$

the angle $\theta_2$ approaches 180° and then becomes undefined. That is, second liquid 302 has a tendency to contract along the substrate interface and spread along the interface between first liquid 300 and gas 306.

Spreading of second liquid 302 on first liquid 300 can be summarized for three different cases, along with the surface energy relationship for complete spreading. In the first case, drop of second liquid 302 is disposed on layer of first liquid 300, and the drop of the second liquid does not contact substrate 304. Layer of first liquid 300 can be thick or thin, and the first liquid 300 and second liquid 302 are intermixable. Under ideal conditions, when the surface energy of first liquid 300 in the gas 306 is greater than or equal to the surface energy of the second liquid 302 in the gas ($\gamma_{L1G} \geq \gamma_{L2G}$), complete spreading of the drop of second liquid 302 occurs on layer of first liquid 300. In the second case, drop of second liquid 302 is disposed on layer of first liquid 300 while touching and spreading at the same time on substrate 304. The first liquid and second liquid 302 are intermixable. Under ideal conditions, complete spreading occurs when: (i) the surface energy of first liquid 300 in the gas is greater than or equal to the surface energy of second liquid 302 in the gas ($\gamma_{L1G} \geq \gamma_{L2G}$); and (ii) the surface energy of the interface between the first liquid and substrate 304 exceeds the surface energy of the interface between the second liquid and the substrate ($\gamma_{SL1} \geq \gamma_{SL2}$). In the third case, drop of second liquid 302 is disposed on layer of the first liquid 300 while touching substrate 304. Spreading may occur along the interface between second liquid 302 and first liquid 300 or the interface between the second liquid and substrate 304. The first liquid and second liquid 302 are intermixable. Under ideal conditions, complete spreading occurs when the sum of the surface energy of first liquid 300 in the gas and the surface energy of the interface between the first liquid and substrate 304 is greater than or equal to the sum of the surface energy of second liquid 302 in the gas and the surface energy of the interface between the second liquid and the substrate ($\gamma_{L1G}+\gamma_{SL1} \geq \gamma_{L2G}+\gamma_{SL2}$) while the surface energy of first liquid 300 in the gas is greater than or equal to the surface energy of second liquid 302 in the gas ($\gamma_{L1G} \geq \gamma_{L2G}$) or (ii) the surface energy of the interface between the first liquid and substrate 304 exceeds the surface energy of the interface between the second liquid and the substrate ($\gamma_{SL1} \geq \gamma_{SL2}$). When second liquid 302 includes more than one component, complete spreading can occur when the sum of the surface energy of first liquid 300 in the gas and the surface energy of the interface between the first liquid and substrate 304 is greater than or equal to the sum of the surface energy of second liquid 302 in the gas and the surface energy of the interface between the second liquid and the substrate ($\gamma_{L1G}+\gamma_{SL1} \geq \gamma_{L2G}+\gamma_{SL2}$) while the surface energy of first liquid 300 in the gas is greater than or equal to the surface energy of at least one of the components of second liquid 302 in the gas or (ii) the surface energy of the interface between the first liquid and substrate 304 exceeds the surface energy of the interface between one of the components of the second liquid and the substrate.

By pretreating a nanoimprint lithography substrate with a liquid pretreatment composition selected to have a surface energy greater than that of the imprint resist in the ambient atmosphere (e.g., air or an inert gas), the rate at which an imprint resist spreads on the substrate in a drop-on-demand nanoimprint lithography process may be increased and a more uniform thickness of the imprint resist on the substrate may be established before the imprint resist is contacted with the template, thereby facilitating throughput in the nanoimprint lithography process. This substrate pretreatment process reduces dispense time by improving drop spreading and therefore reducing interstitial void volume between the imprint resist drops before imprinting. As used herein, "dispense time" generally refers to the time between drop dispense and the template touching the drops. If the pretreatment composition includes polymerizable components capable of intermixing with the imprint resist, then this can advantageously contribute to formation of the resulting polymeric layer without the addition of undesired components, and may result in more uniform curing, thereby providing more uniform mechanical and etch properties.

Figure 4:
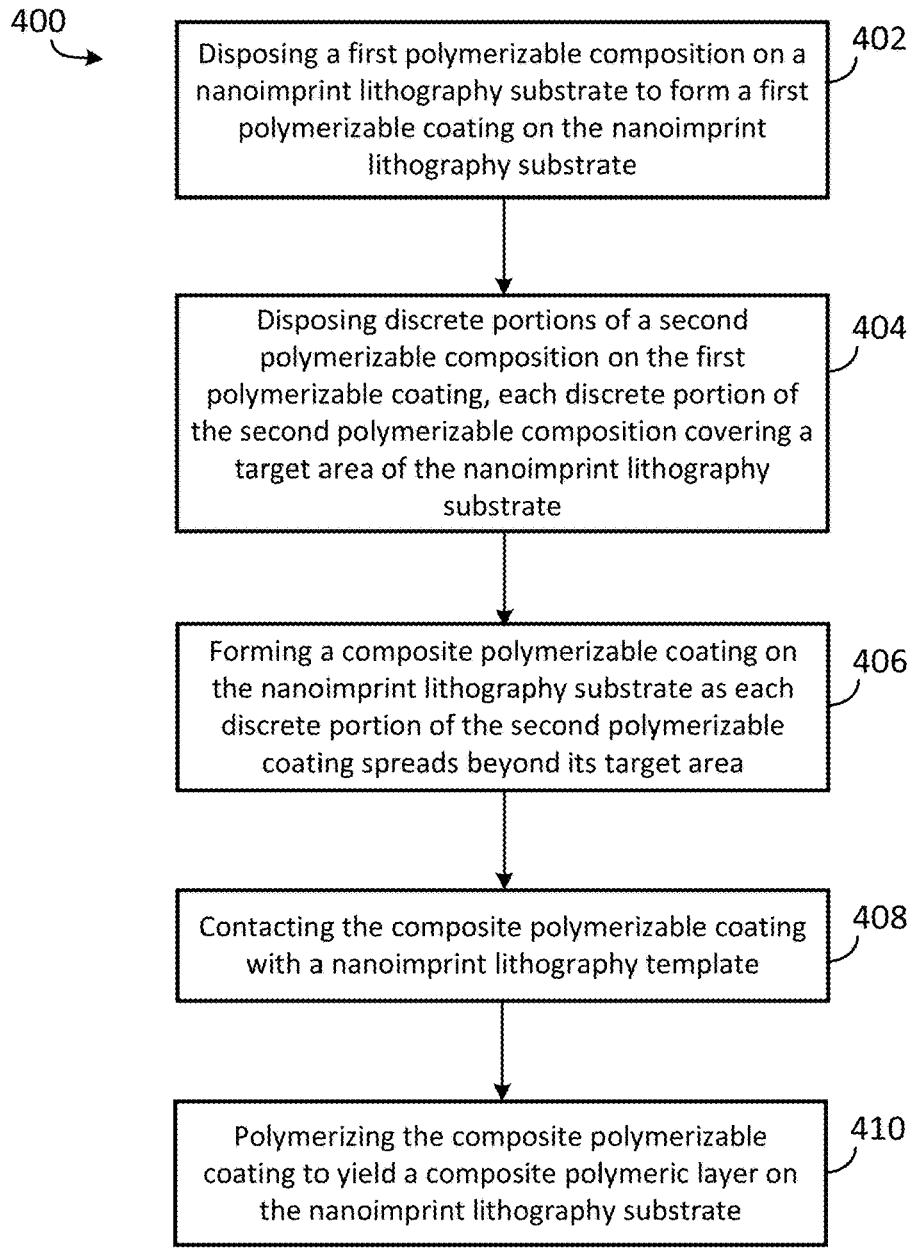
FIG. 4 is a flowchart depicting a process for facilitating nanoimprint lithography throughput.

FIG. 4 is a flowchart showing a process 400 for facilitating throughput in drop-on-demand nanoimprint lithography. Process 400 includes operations 402-410. In operation 402, a pretreatment composition is disposed on a nanoimprint lithography substrate to form a pretreatment coating on the substrate. In operation 404, discrete portions ("drops") of an imprint resist are disposed on the pretreatment coating, with each drop covering a target area of the substrate. The pretreatment composition and the imprint resist are selected such that the interfacial surface energy between the pretreatment composition and the air exceeds the interfacial surface energy between the imprint resist and the air.

In operation 406, a composite polymerizable coating ("composite coating") is formed on the substrate as each drop of the imprint resist spreads beyond its target area. The composite coating includes a homogeneous or inhomogeneous mixture of the pretreatment composition and the imprint resist. In operation 408, the composite coating is contacted with a nanoimprint lithography template ("template"), and allowed to spread and fill all the volume between the template and substrate, and in operation 410, the composite coating is polymerized to yield a polymeric layer on the substrate. After polymerization of the composite coating, the template is separated from the polymeric layer, leaving a nanoimprint lithography stack. As used herein, "nanoimprint lithography stack" generally refers to the substrate and the polymeric layer adhered to the substrate, each or both of which may include one or more additional (e.g., intervening) layers. In one example, the substrate includes a base and an adhesion layer adhered to the base.

The surface energy of an imprint resist plays a role in the capillary action between the template and substrate during resist spreading. The pressure difference on two sides of the formed capillary meniscus is proportional to the surface energy of the liquid. The higher the surface energy, the greater the driving force for liquid spreading. Thus, higher surface energy imprint resists are typically preferred. The dynamics of resist drop spreading while interacting with a pretreatment composition depends on viscosities of both the imprint resist and the pretreatment composition. An imprint resist or pretreatment composition having a higher viscosity tends to slow the drop spread dynamics and may, for instance, slow down the imprint process. The capillary pressure difference is proportional to the interfacial tension, $\gamma$, and inversely proportional to the effective radius, r, of the interface, and also depends on the wetting angle, $\theta$, of the liquid on the surface of the capillary. Imprint resists with high surface tension and lower contact angles are desirable for fast filling in a nanoimprint lithography process. The contact angle of an imprint resist on the surface of a nanoimprint lithography template surface is typically less than 90°, less than 50°, or less than 30°.

In process 400, the pretreatment composition and the imprint resist may include a mixture of components as described, for example, in U.S. Pat. Nos. 7,157,036 and 8,076,386, as well as Chou et al. 1995, Imprint of sub-25 nm vias and trenches in polymers. *Applied Physics Letters* 67(21):3114-3116; Chou et al. 1996, Nanoimprint lithography. *Journal of Vacuum Science Technology B* 14(6): 4129-4133; and Long et al. 2007, Materials for step and flash imprint lithography (S-FIL®). *Journal of Materials Chemistry* 17:3575-3580, all of which are incorporated by reference herein. Suitable compositions include polymerizable monomers ("monomers"), crosslinkers, resins, photoinitiators, surfactants, or any combination thereof. Classes of monomers include acrylates, methacrylates, vinyl ethers, and epoxides, as well as polyfunctional derivatives thereof. In some cases, the pretreatment composition, the imprint resist, or both are substantially free of silicon. In other cases, the pretreatment composition, the imprint resist, or both are silicon-containing. Silicon-containing monomers include, for example, siloxanes and disiloxanes. Resins can be silicon-containing (e.g., silsesquioxanes) and non-silicon-containing (e.g., novolak resins). The pretreatment composition, the imprint resist, or both may also include one or more polymerization initiators or free radical generators. Classes of polymerization initiators include, for example, photoinitiators (e.g., acyloins, xanthones, and phenones), photoacid generators (e.g., sulfonates and onium salts), and photobase generators (e.g., ortho-nitrobenzyl carbamates, oxime urethanes, and O-acyl oximes). In some cases, the pretreatment composition is free or substantially free of polymerization initiators, free radical generators, or both.

Suitable monomers include monofunctional, difunctional, or multifunctional acrylates, methacrylates, vinyl ethers, and epoxides, in which mono-, di-, and multi- refer to one, two, and three or more of the indicated functional groups, respectively. Some or all of the monomers may be fluorinated (e.g., perfluorinated). In the case of (meth)acrylates, for example, the pretreatment, the imprint resist, or both may include one or more monofunctional (meth)acrylates, one or more difunctional (meth)acrylates, one or more multifunctional (meth)acrylates, or a combination thereof. For simplicity, "acrylate" is used to denote "(meth)acrylate" herein. That is, for each acrylate disclosed, the corresponding methacrylate is also disclosed.

Examples of suitable monofunctional acrylates include isobornyl acrylate, 3,3,5-trimethylcyclohexyl acrylate, dicyclopentenyl acrylate, benzyl acrylate, 1-naphthyl acrylate, 4-cyanobenzyl acrylate, pentafluorobenzyl acrylate, 2-phenylethyl acrylate, phenyl acrylate, (2-ethyl-2-methyl-1,3-dioxolan-4-yl)methyl acrylate, n-hexyl acrylate, 4-tert-butylcyclohexyl acrylate, methoxy polyethylene glycol (350) monoacrylate, and methoxy polyethylene glycol (550) monoacrylate.

Examples of suitable diacrylates include ethylene glycol diacrylate, diethylene glycol diacrylate, triethylene glycol diacrylate, tetraethylene glycol diacrylate, polyethylene glycol diacrylate (e.g., Mn, avg=575), 1,2-propanediol diacrylate, dipropylene glycol diacrylate, tripropylene glycol diacrylate, polypropylene glycol diacrylate, 1,3-propanediol diacrylate, 1,4-butanediol diacrylate, 2-butene-1,4-diacrylate, 1,3-butylene glycol diacrylate, 3-methyl-1,3-butanediol diacrylate, 1,5-pentanediol diacrylate, 1,6-hexanediol diacrylate, 1H,1H,6H,6H-perfluoro-1,6-hexanediol diacrylate, 1,9-nonanediol diacrylate, 1,10-decanediol diacrylate, 1,12-dodecanediol diacrylate, neopentyl glycol diacrylate, cyclohexane dimethanol diacrylate, tricyclodecane dimethanol diacrylate, bisphenol A diacrylate, ethoxylated bisphenol A diacrylate, m-xylylene diacrylate, ethoxylated (3) bisphenol A diacrylate, ethoxylated (4) bisphenol A diacrylate, ethoxylated (10) bisphenol A diacrylate, dicyclopentanyl diacrylate, 1,2-adamantanediol diacrylate, 2,4-diethylpentane-1,5-diol diacrylate, poly(ethylene glycol) (400) diacrylate, poly(ethylene glycol) (300) diacrylate, 1,6-hexanediol $(EO)_2$ diacrylate, 1,6-hexanediol $(EO)_5$ diacrylate, and alkoxylated aliphatic diacrylate ester.

Examples of suitable multifunctional acrylates include trimethylolpropane triacrylate, propoxylated trimethylolpropane triacrylate (e.g., propoxylated (3) trimethylolpropane triacrylate, propoxylated (6) trimethylolpropane triacrylate), trimethylolpropane ethoxylate triacrylate (e.g., n~1.3, 3, 5), di(trimethylolpropane) tetraacrylate, propoxylated glyceryl triacrylate (e.g., propoxylated (3) glyceryl triacrylate), tris(2-hydroxy ethyl) isocyanurate triacrylate, pentaerythritol triacrylate, pentaerythritol tetraacrylate, ethoxylated pentaerythritol tetraacrylate, dipentaerythritol pentaacrylate, tripentaerythritol octaacrylate.

Monomers suitable for the pretreatment composition typically have a molecular mass in a range between about 300 and about 750, and demonstrate a sufficiently low viscosity to achieve rapid spreading and a sufficiently low vapor pressure to limit evaporation. A monomer with a low viscosity spreads more rapidly on the substrate than a monomer with a high viscosity at the same temperature, while a monomer with high vapor pressure evaporates more rapidly from a substrate than a monomer with a low vapor pressure at the same temperature. Thus, selecting a monomer with a low viscosity and a low vapor pressure promotes rapid spreading of the monomer and limits evaporation, thereby promoting film stability and uniformity. Viscosity is generally associated with molecular mass, with a lower molecular mass typically corresponding to a lower viscosity and a higher molecular mass typically corresponding to a higher viscosity. Vapor pressure is also generally associated with molecular mass, with a higher molecular mass typically corresponding to a lower vapor pressure and a lower molecular mass typically corresponding to a higher vapor pressure. Thus, selecting monomers for the pretreatment composition involves a trade-off between low molecular mass (low viscosity) and high molecular mass (low vapor pressure).

Monomers described herein may include glycol units, such as ethylene glycol units (EO or —OCH$_2$CH$_2$O—) or propylene glycol units (PO or —OCH(CH$_3$)CH$_2$O—). For example, bisphenol A diacrylate with different numbers of ethylene glycol units are commercially available (bisphenol A $(EO)_n$ diacrylate). The viscosity of a monomer typically decreases as the number of glycol units is increased, for example, through ethoxylation (addition of ethylene glycol units) or propoxylation (addition of propylene glycol units). Alkoxylated monomers, or monomers with glycol units, are suitable monomers for pretreatment compositions. Alkoxylation (addition of glycol units), and especially ethoxylation (addition of ethylene glycol units), provide a higher molecular mass, which lowers vapor pressure, while also increasing or maintaining high surface tension, thereby enhancing spreading of an imprint resist on the pretreatment composition.

Examples of monomers suitable for the pretreatment composition include tripropylene glycol diacrylate, tetraethylene glycol diacrylate, poly(ethylene glycol) diacrylates (e.g., PEG200 diacrylate, PEG300 diacrylate, PEG400 diacrylate, etc.), tricyclodecane dimethanol diacrylate, stearyl acrylate, iso-stearyl acrylate, alkoxylated 1,6-hexanediol diacrylates (e.g., 1,6-hexanediol $(EO)_2$ diacrylate, 1,6-hexanediol $(EO)_5$ diacrylate, 1,6-hexanediol $(PO)_2$ diacrylate, 1,6-hexanediol $(PO)_3$ diacrylate, etc.), phenol tetraethylene glycol acrylate, neopentylglycol dipropylene glycol diacrylate, 1,12-dodecanediol dimethacrylate, 1,3-bis((2-hydroxyethoxy)methyl)benzene diacrylate, 4-hexylresorcinol diacrylate, 1,4-bis((2-hydroxyethoxy)methyl)cyclohexane diacrylate, 1,3-bis((2-hydroxyethoxy)methyl)cyclohexane diacrylate, 3-benzyloxy-1,2-propanediol $(EO)_n$ diacrylate (n=1-6), 2-phenyl-1,3-propanediol $(EO)_2$ diacrylate, 4-benzyloxy-1,3-butanediol diacrylate, 4-benzyloxy-1,3-butanediol $(EO)_2$ diacrylate, trimethylolpropane trimethacrylate, caprolactone acrylate, pentaerythritol tetraacrylate, alkoxylated pentaerythritol tetraacrylate (e.g. pentaerythritol $(EO)_4$ tetraacrylate, etc.), alkoxylated nonyl phenol acrylate (e.g. nonyl phenol$(EO)_4$ acrylate, nonyl phenol$(EO)_8$ acrylate, nonyl phenol$(PO)_2$ acrylate, etc.), methoxy polyethylene glycol monoacrylates (methoxy polyethylene glycol (350) monoacrylate, methoxy polyethylene glycol (550) monoacrylate, etc.), alkoxylated lauryl acrylate, propoxylated (3) glyceryl triacrylate, alkoxylated trimethylolpropane triacrylate (e.g. trimethylolpropane$(EO)_3$ triacrylate, trimethylolpropane$(EO)_6$, triacrylate, trimethylolpropane$(PO)_3$ triacrylate, etc.), ethoxylated bisphenol A diacrylate (e.g. bisphenol A $(EO)_3$ diacrylate, bisphenol A $(EO)_4$ diacrylate, etc.), ditrimethylolpropane tetraacrylate, dipentaerythritol pentaacrylate, and dipentaerythritol hexaacrylate.

Examples of suitable crosslinkers include difunctional acrylates and multifunctional acrylates, such as those described herein.

The photoinitiators are preferably radical generators. Examples of suitable radical generators include, but are not limited to, 2,4,5-triarylimidazole dimers optionally having substituents such as a 2-(o-chlorophenyl)-4,5-diphenylimidazole dimer, a 2-(o-chlorophenyl)-4,5-di(methoxyphenyl)imidazole dimer, a 2-(o-fluorophenyl)-4,5-diphenylimidazole dimer, and a 2-(o- or p-methoxyphenyl)-4,5-diphenylimidazole dimer; benzophenone derivatives such as benzophenone, N,N'-tetramethyl-4,4'-diaminobenzophenone (Michler's ketone), N,N'-tetraethyl-4,4'-diaminobenzophenone, 4-methoxy-4'-dimethylaminobenzophenone, 4-chlorobenzophenone, 4,4'-dimethoxybenzophenone, and 4,4'-diaminobenzophenone; α-amino aromatic ketone derivatives such as 2-benzyl-2-dimethylamino-1-(4-morpholinophenyl)-butanone-1,2-methyl-1-[4-(methylthio)phenyl]-2-morpholino-propan-1-one; quinones such as 2-ethylanthraquinone, phenanthrenequinone, 2-t-butylanthraquinone, octamethylanthraquinone, 1,2-benzanthraquinone, 2,3-benzanthraquinone, 2-phenyl anthraquinone, 2,3-diphenylanthraquinone, 1-chloroanthraquinone, 2-methylanthraquinone, 1,4-naphthoquinone, 9,10-phenanthraquinone, 2-methyl-1,4-naphthoquinone, and 2,3-dimethylanthraquinone; benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acridine derivatives such as 9-phenylacridine and 1,7-bis(9,9'-acridinyl) heptane; N-phenylglycine derivatives such as N-phenylglycine; acetophenone derivatives such as acetophenone, 3-methylacetophenone, acetophenone benzyl ketal, 1-hydroxycyclohexyl phenyl ketone, and 2,2-dimethoxy-2-phenylacetophenone; thioxanthone derivatives such as thioxanthone, diethylthioxanthone, 2-isopropylthioxanthone, and 2-chlorothioxanthone; acylphosphine oxide derivatives such as 2,4,6-trimethylbenzoyl diphenylphosphine oxide, bis(2,4,6-trimethylbenzoyl)phenylphosphine oxide, and bis(2,6-dimethoxybenzoyl)-2,4,4-trimethylpentylphosphine oxide; oxime ester derivatives such as 1,2-octanedione, 1-[4-(phenylthio)-,2-(O-benzoyloxime)], ethanone and 1-[9-ethyl-6-(2-methylbenzoyl)-9H-carbazol-3-yl]-,1-(O-acetyloxime); and xanthone, fluorenone, benzaldehyde, fluorene, anthraquinone, triphenylamine, carbazole, 1-(4-isopropylphenyl)-2-hydroxy-2-methylpropan-1-one, and 2-hydroxy-2-methyl-1-phenylpropan-1-one.

Examples of commercially available products of the radical generators include, but are not limited to, IRGACURE 184, 250, 270, 290, 369, 379, 651, 500, 754, 819, 907, 784, 1173, 2022, 2100, 2959, 4265, BP, MBF, OXE01, OXE02, PAG121, PAG203, CGI-1700, -1750, -1850, CG24-61, CG2461, DAROCUR 1116, 1173, LUCIRIN TPO, TPO-L, LR8893, LR8953, LR8728 and LR8970 manufactured by BASF; and EBECRYL P36 manufactured by UCB.

Acylphosphine oxide polymerization initiators or alkylphenone polymerization initiators are preferred. Among the examples listed above, the acylphosphine oxide polymerization initiators are acylphosphine oxide compounds such as 2,4,6-trimethylbenzoyl diphenylphosphine oxide, bis(2,4,6-trimethylbenzoyl)-phenylphosphine oxide, and bis(2,6-dimethoxybenzoyl)-2,4,4-trimethylpentylphosphine oxide. Among the examples listed above, the alkylphenone polymerization initiators are benzoin ether derivatives such as benzoin methyl ether, benzoin ethyl ether, and benzoin phenyl ether; benzoin derivatives such as benzoin, methylbenzoin, ethylbenzoin, and propylbenzoin; benzyl derivatives such as benzyl dimethyl ketal; acetophenone derivatives such as acetophenone, 3-methyl acetophenone, acetophenone benzyl ketal, 1-hydroxycyclohexyl phenyl ketone, and 2,2-dimethoxy-2-phenylacetophenone; and α-amino aromatic ketone derivatives such as 2-benzyl-2-dimethylamino-1-(4-morpholinophenyl)-butanone-1,2-methyl-1-[4-(methylthio)phenyl]-2-morpholinopropan-1-one.

The content of the photoinitiators is 0.1 wt % or more and 50 wt % or less, preferably 0.1 wt % or more and 20 wt % or less, more preferably 1 wt % or more and 20 wt % or less, with respect to the total weight of all components except for solvent components.

When the photoinitiator content is 0.1 wt % or more with respect to the total weight excluding solvent components, the curing rate of a curable composition can be accelerated. As a result, reaction efficiency can be improved. When the content is 50 wt % or less with respect to the total weight excluding solvent components, the resulting cured product can be a cured product having mechanical strength to some extent.

Examples of suitable photoinitiators include IRGACURE 907, IRGACURE 4265, 651, 1173, 819, TPO, and TPO-L.

A surfactant can be applied to a patterned surface of an imprint lithography template, added to an imprint lithography resist, or both, to reduce the separation force between the solidified resist and the template, thereby reducing separation defects in imprinted patterns formed in an imprint lithography process and to increase the number of successive imprints that can be made with an imprint lithography template. Factors in selecting a release agent for an imprint resist include, for example, affinity with the surface, desired surface properties of the treated surface, and shelf life of the release agent in an imprint resist. While some release agents form covalent bonds with the template, fluorinated, non-ionic surfactants interact with template surfaces via non-covalent-bonding interactions such as hydrogen bonding and van der Waals interactions.

Examples of suitable surfactants include fluorinated and non-fluorinated surfactants. The fluorinated and non-fluorinated surfactants may be ionic or non-ionic surfactants. Suitable non-ionic fluorinated surfactants include fluoroaliphatic polymeric esters, perfluoroether surfactants, fluorosurfactants of polyoxyethylene, fluorosurfactants of polyalkyl ethers, fluoroalkyl polyethers, and the like. Suitable non-ionic non-fluorinated surfactants include ethoxylated alcohols, ethoxylated alkylphenols, and polyethyleneoxide-polypropyleneoxide block copolymers.

Exemplary commercially available surfactant components include, but are not limited to, ZONYL® FSO and ZONYL® FS-300, manufactured by E.I. du Pont de Nemours and Company having an office located in Wilmington, Del.; FC-4432 and FC-4430, manufactured by 3M having an office located in Maplewood, Minn.; MASURF® FS-1700, FS-2000, and FS-2800 manufactured by Pilot Chemical Company having an office located in Cincinnati, Ohio; S-107B, manufactured by Chemguard having an office located in Mansfield, Tex.; FTERGENT 222F, FTERGENT 250, FTERGENT 251, manufactured by NEOS Chemical Chuo-ku, Kobe-shi, Japan; PolyFox PF-656, manufactured by OMNOVA Solutions Inc. having an office located in Akron, Ohio; Pluronic L35, L42, L43, L44, L63, L64, etc. manufactured by BASF having an office located in Florham Park, N.J.; Brij 35, 58, 78, etc. manufactured by Croda Inc. having an office located in Edison, N.J.

Further, the pretreatment composition and the imprint resist may include one or more non-polymerizable compounds according to various purposes without impairing the effects of this disclosure, in addition to the components mentioned above. Examples of such components include sensitizers, hydrogen donors, antioxidants, polymer components, and other additives.

Sensitizers are compounds that are appropriately added for the purpose of accelerating polymerization reaction or improving reaction conversion rates. Examples of suitable sensitizers include sensitizing dyes.

Sensitizing dyes are compounds that are excited by absorbing light with a particular wavelength to interact with the photoinitiators serving as component (B). As used herein, the interaction refers to energy transfer, electron transfer, etc., from the sensitizing dyes in an excited state to the photoinitiators serving as component (B).

Specific examples of suitable sensitizing dyes include, but are not limited to, anthracene derivatives, anthraquinone derivatives, pyrene derivatives, perylene derivatives, carbazole derivatives, benzophenone derivatives, thioxanthone derivatives, xanthone derivatives, coumarin derivatives, phenothiazine derivatives, camphorquinone derivatives, acridine dyes, thiopyrylium salt dyes, merocyanine dyes, quinoline dyes, styrylquinoline dyes, ketocoumarin dyes, thioxanthene dyes, xanthene dyes, oxonol dyes, cyanine dyes, rhodamine dyes, and pyrylium salt dyes.

One type of these sensitizers may be used alone, or two or more types of these sensitizers may be used as a mixture.

Hydrogen donors are compounds that react with initiation radicals generated from the photoinitiators serving as component (B), or radicals at the growing ends of polymers to generate more reactive radicals. Hydrogen donors are preferably added when component (B) is one or more photoradical generators.

Specific examples of suitable hydrogen donors include, but are not limited to, amine compounds such as n-butylamine, di-n-butylamine, tri-n-butylamine, allylthiourea, s-benzylisothiuronium-p-toluenesulfinate, triethylamine, diethylaminoethyl methacrylate, triethylenetetramine, 4,4'-bis(dialkylamino)benzophenone, N,N-dimethylaminobenzoic acid ethyl ester, N,N-dimethylaminobenzoic acid isoamyl ester, pentyl-4-dimethylaminobenzoate, triethanolamine, and N-phenylglycine; and mercapto compounds such as 2-mercapto-N-phenylbenzimidazole and mercaptopropionic acid ester.

One type of these hydrogen donors may be used alone, or two or more types of these hydrogen donors may be used as a mixture. Also, the hydrogen donors may have functions as sensitizers.

The content of these components (non-polymerizable compounds) in the imprint resist is 0 wt % or more and 50 wt % or less, preferably 0.1 wt % or more and 50 wt % or less, more preferably 0.1 wt % or more and 20 mass % or less, with respect to the total weight of all components except for solvent components.

Further, the imprint resist may include one or more solvents as an additional component. Preferred solvents include, but are not limited to, solvents having a boiling point of 80° C. or higher and 200° C. or lower at ordinary pressure. Solvents each having at least one of a hydroxyl group, ether structure, ester structure, or ketone structure are more preferred.

Specific examples of suitable solvents include alcohol solvents such as propyl alcohol, isopropyl alcohol, and butyl alcohol; ether solvents such as ethylene glycol monomethyl ether, ethylene glycol dimethyl ether, ethylene glycol monoethyl ether, ethylene glycol diethyl ether, ethylene glycol monobutyl ether, and propylene glycol monomethyl ether; ester solvents such as butyl acetate, ethylene glycol monoethyl ether acetate, ethylene glycol monobutyl ether acetate, and propylene glycol monomethyl ether acetate; and ketone solvents such as methyl isobutyl ketone, diisobutyl ketone, cyclohexanone, 2-heptanone, γ-butyrolactone, and ethyl lactate. A single solvent or a mixed solvent selected from these solvents is preferred.

In some cases, the pretreatment composition may be combined with one or more solvents. In one example, in which the pretreatment composition is applied via spin-coating, the pretreatment composition is combined with one or more solvents to promote spreading on the substrate, after which substantially all of the solvent is evaporated to leave the pretreatment composition on the substrate.

Solvents suitable for combining with the pretreatment composition generally include those described with respect to the imprint resist. For spin-coating applications of the pretreatment composition, a single solvent or a mixed solvent selected from propylene glycol monomethyl ether acetate, propylene glycol monomethyl ether, cyclohexanone, 2-heptanone, γ-butyrolactone, and ethyl lactate is particularly preferred from the viewpoint of coating properties.

The content of the solvent components to be combined with the pretreatment composition can be appropriately adjusted by viscosity, coating properties, the film thickness of a formed cured layer, etc., and is preferably 70 wt % or more, preferably 90 wt % or more, further preferably 95 wt % or more, with respect to the total amount of the pretreatment composition and the solvent. A larger content of the solvent components can make the film thickness of the pretreatment composition thinner. If the content of the solvent components is 70 wt % or less of the solvent/pretreatment composition mixture, adequate coating properties may not be obtained.

Although such solvents may be used in the imprint resist, it is preferred that the imprint resist should substantially contain no solvent. As used herein, the phrase "substantially contain no solvent" refers to being free from solvents other than solvents, such as impurities, which are contained unintentionally. For example, the content of the solvents in the imprint resist according to the present embodiment is preferably 3 wt % or less, more preferably 1 wt % or less, with respect to the whole imprint resist. As used herein, the solvents refer to solvents that are generally used in curable compositions or photoresists. In other words, the solvents are not limited by their types as long as the solvents can dissolve and uniformly disperse the compounds used in this invention without reacting with these compounds.

In some examples, an imprint resist includes 0 wt % to 80 wt % (e.g., 20 wt % to 80 wt % or 40 wt % to 80 wt %) of one or more monofunctional acrylates; 90 wt % to 98 wt % of one or more difunctional or multifunctional acrylates (e.g., the imprint resist may be substantially free of monofunctional acrylates) or 20 wt % to 75 wt % of one or more difunctional or multifunctional acrylates (e.g., when one or more monofunctional acrylates is present); 1 wt % to 10 wt % of one or more photoinitiators; and 1 wt % to 10 wt % of one or more surfactants. In one example, an imprint resist includes about 40 wt % to about 50 wt % of one or more monofunctional acrylates, about 45 wt % to about 55 wt % of one or more difunctional acrylates, about 4 wt % to about 6 wt % of one or more photoinitiators, and about 3 wt % surfactant. In another example, an imprint resist includes about 44 wt % of one or more monofunctional acrylates, about 48 wt % of one or more difunctional acrylates, about 5 wt % of one or more photoinitiators, and about 3 wt % surfactant. In yet another example, an imprint resist includes about 10 wt % of a first monofunctional acrylate (e.g., isobornyl acrylate), about 34 wt % of a second monofunctional acrylate (e.g., benzyl acrylate) about 48 wt % of a difunctional acrylate (e.g., neopentyl glycol diacrylate), about 2 wt % of a first photoinitiator (e.g., IRGACURE TPO), about 3 wt % of a second photoinitiator (e.g., DAROCUR 4265), and about 3 wt % surfactant. Examples of suitable surfactants include X—R—(OCH$_2$CH$_2$)$_n$OH, where R=alkyl, aryl, or poly(propylene glycol), X=H or —(OCH$_2$CH$_2$)$_n$OH, and n is an integer (e.g., 2 to 20, 5 to 15, or 10-12) (e.g., X=—(OCH$_2$CH$_2$)$_n$OH, R=poly(propylene glycol), and n=10-12); a fluorosurfactant, where X=perfluorinated alkyl or perfluorinated ether, or a combination thereof. The viscosity of the imprint resist is typically in a range of 1 cP to 50 cP, 1 cP to 25 cP, or 5 cP to 15 cP at 23° C. The interfacial surface energy between the imprint resist and air is typically in a range of 20 mN/m to 60 mN/m, 28 mN/m to 40 mN/m, or 32 mN/m to 35 mN/m. Viscosity and interfacial surface energy are assessed as described in the Examples herein.

In one example, a pretreatment composition includes 0 wt % to 80 wt % (e.g., 20 wt % to 80 wt % or 40 wt % to 80 wt %) of one or more monofunctional acrylates; 90 wt % to 100 wt % of one or more difunctional or multifunctional acrylates (e.g., the pretreatment composition is substantially free of monofunctional acrylates) or 20 wt % to 75 wt % of one or more difunctional or multifunctional acrylates (e.g., when one or more monofunctional acrylates is present); 0 wt % to 10 wt % of one or more photoinitiators; and 0 wt % to 10 wt % of one or more surfactants.

The pretreatment composition is typically miscible with the imprint resist. The pretreatment composition typically has a low vapor pressure, such that it remains present as a thin film on the substrate until the composite coating is polymerized. In one example, the vapor pressure of a pretreatment composition is less than $1 \times 10^{-4}$ mmHg at 25° C. The pretreatment composition also typically has a low viscosity to facilitate rapid spreading of the pretreatment composition on the substrate. In one example, the viscosity of a pretreatment composition is typically in a range of 1 cP to 200 cP, 1 cP to 150 cP, 1 cP to 100 cP, or 1 cP to 50 cP at 23° C. The interfacial surface energy between the pretreatment composition and air or a polymerizable component in the pretreatment composition and air is typically between 30 mN/m and 45 mN/m. The interfacial surface energy between the pretreatment composition and air or a polymerizable component in the pretreatment composition and air is typically at least 35 mN/m, at least 36 mN/m, at least 37 mN/m, or at least 38 mN/m. An average spreading rate of the imprint resist on the pretreatment composition to form the composite layer exceeds an average spreading rate of the imprint resist on an nanoimprint lithography substrate under otherwise identical conditions. The pretreatment composition is typically selected to be chemically stable, such that decomposition does not occur during use.

It is preferred that the pretreatment composition and the imprint resist should include impurities at the smallest possible content. As used herein, the impurities mean anything other than the components mentioned above. Thus, the pretreatment composition and the imprint resist are preferably obtained through a purification process. Such a purification process is preferably filtration using a filter, etc. For the filtration using a filter, specifically, it is preferred that the components mentioned above and optional additive components should be mixed and then filtered through a filter having a pore size of, for example, 0.001 μm or larger and 5.0 μm or smaller. For the filtration using a filter, it is more preferred that this filtration should be carried out in multiple stages or repeated multiple times. Also, the filtered solution may be filtered again. A plurality of filters differing in pore size may be used in the filtration. Filter(s) made of polyethylene resin, polypropylene resin, fluorine resin, nylon resin, or the like can be used in the filtration, though the filter is not limited thereto. Impurities, such as particles, mixed in the composition can be removed through such a purification process. This can prevent impurities such as particles from causing pattern defects resulting from careless irregularities in cured films obtained by curing curable compositions.

In the case of using the pretreatment composition and the imprint resist for producing semiconductor integrated circuits, it is preferred to avoid, as much as possible, the mixing of impurities containing metal atoms (metal impurities) in curable compositions, for preventing the operation of products from being inhibited. In such a case, the concentration of the metal impurities contained in the curable composition is preferably 10 ppm or lower, more preferably 100 ppb or lower.

A pretreatment composition may be a single polymerizable component (e.g., a monomer such as a monofunctional acrylate, a difunctional acrylate, or a multifunctional acrylate), a mixture of two or more polymerizable components (e.g., a mixture of two or more monomers), or a mixture of one or more polymerizable components and one or more other components (e.g., a mixture of monomers; a mixture of two or more monomers and a surfactant, a photoinitiator, or both; and the like). In some examples, a pretreatment composition includes trimethylolpropane triacrylate, trimethylolpropane ethoxylate triacrylate, 1,12-dodecanediol diacrylate, poly(ethylene glycol) diacrylate, tetraethylene glycol diacrylate, 1,3-adamantanediol diacrylate, nonanediol diacrylate, m-xylylene diacrylate, dicyclopentanyl diacrylate, or any combination thereof.

Mixtures of polymerizable components may result in synergistic effects, yielding pretreatment compositions having a more advantageous combination of properties (e.g., low viscosity, good etch resistance and film stability) than a pretreatment composition with a single polymerizable component. In one example, the pretreatment composition is a mixture of 1,12-dodecanediol diacrylate and tricyclodecane dimethanol diacrylate. In another example, the pretreatment composition is a mixture of tricyclodecane dimethanol diacrylate and tetraethylene glycol diacrylate. The pretreatment composition is generally selected such that one or more components of the pretreatment composition polymerizes (e.g., covalently bonds) with one or more components of the imprint resist during polymerization of the composite polymerizable coating. In some cases, the pretreatment composition includes a polymerizable component that is also in the imprint resist, or a polymerizable component that has a functional group in common with one or more polymerizable components in the imprint resist (e.g., an acrylate group). Suitable examples of pretreatment compositions include multifunctional acrylates such as those described herein, including propoxylated (3) trimethylolpropane triacrylate, trimethylolpropane triacrylate, and dipentaerythritol pentaacrylate.

A pretreatment composition may be selected such that the etch resistance is generally comparable to the etch resistance of the imprint resist, thereby promoting etch uniformity. In certain cases, a pretreatment composition is selected such that the interfacial surface energy at an interface between the pretreatment and air exceeds that of the imprint resist used in conjunction with the pretreatment composition, thereby promoting rapid spreading of the liquid imprint resist on the liquid pretreatment composition to form a uniform composite coating on the substrate before the composite coating is contacted with the template. The interfacial surface energy between the pretreatment composition and air typically exceeds that between the imprint resist and air or between at least a component of the imprint resist and air by 0.5 mN/m to 25 mN/m, 0.5 mN/m to 15 mN/m, 0.5 mN/m to 7 mN/m, 1 mN/m to 25 mN/m, 1 mN/m to 15 mN/m, or 1 mN/m to 7 mN/m although these ranges may vary based on chemical and physical properties of the pretreatment composition and the imprint resist and the resulting interaction between these two liquids. When the difference between surface energies is too low, limited spreading of the imprint resist results, and the drops maintain a spherical cap-like shape and remain separated by the pretreatment composition. When the difference between surface energies is too high, excessive spreading of the imprint resist results, with most of the imprint resist moving toward the adjacent drops, emptying the drop centers, such that the composite coating has convex regions above the drop centers. Thus, when the difference between surface energies is too low or too high, the resulting composite coating is nonuniform, with significant concave or convex regions. When the difference in surface energies is appropriately selected, the imprint resist spreads quickly to yield a substantially uniform composite coating. Advantageous selection of the pretreatment composition and the imprint resist allows fill time to be reduced by 50-90%, such that filling can be achieved in as little as 1 sec, or in some cases even as little as 0.1 sec.

Figure 5A:
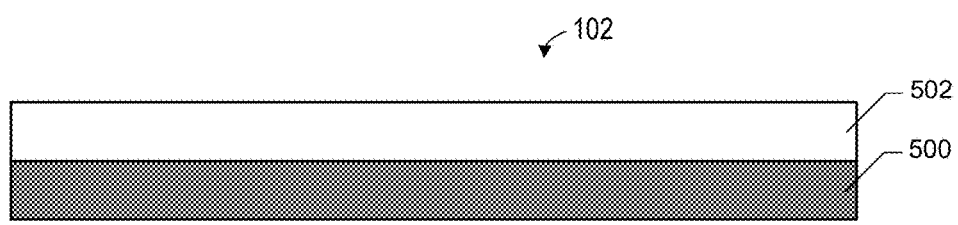
FIG. 5A depicts a substrate.

Referring to operation 402 of process 400, FIG. 5A depicts substrate 102 including base 500 and adhesion layer 502. Base 500 is typically a silicon wafer. Other suitable materials for base 500 include fused silica, quartz, silicon germanium, gallium arsenide, and indium phosphide. Adhesion layer 502 serves to increase adhesion of the polymeric layer to base 500, thereby reducing formation of defects in the polymeric layer during separation of the template from the polymeric layer after polymerization of the composite coating. A thickness of adhesion layer 502 is typically between 1 nm and 10 nm. Examples of suitable materials for adhesion layer 502 include those disclosed in U.S. Pat. Nos. 7,759,407; 8,361,546; 8,557,351; 8,808,808; and 8,846,195, all of which are incorporated by reference herein. In one example, an adhesion layer is formed from a composition including ISORAD 501, CYMEL 303ULF, CYCAT 4040 or TAG 2678 (a quaternary ammonium blocked trifluoromethanesulfonic acid), and PM Acetate (a solvent consisting of 2-(1-methoxy)propyl acetate available from Eastman Chemical Company of Kingsport, Tenn.). In some cases, substrate 102 includes one or more additional layers between base 500 and adhesion layer 502. In certain cases, substrate 102 includes one or more additional layers on adhesion layer 502. For simplicity, substrate 102 is depicted as including only base 500 and adhesion layer 502.

Figure 5B:
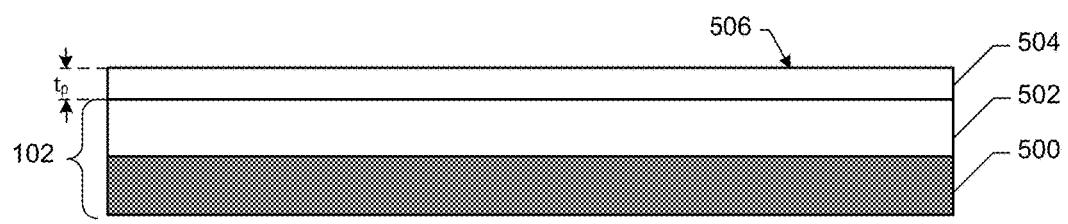
FIG. 5B depicts a pretreatment coating disposed on a substrate.

FIG. 5B depicts pretreatment composition 504 after the pretreatment composition has been disposed on substrate 102 to form pretreatment coating 506. As depicted in FIG. 5B, pretreatment coating 506 is formed directly on adhesion layer 502 of substrate 102. In some cases, pretreatment coating 506 is formed on another surface of substrate 102 (e.g., directly on base 500). Pretreatment coating 506 is formed on substrate 102 using techniques such as spin-coating, dip coating, chemical vapor deposition (CVD), physical vapor deposition (PVD). In the case of, for example, spin-coating or dip coating and the like, the pretreatment composition can be dissolved in one or more solvents (e.g., propylene glycol methyl ether acetate (PGMEA), propylene glycol monomethyl ether (PGME), and the like) for application to the substrate, with the solvent then evaporated away to leave the pretreatment coating. A thickness $t_p$ of pretreatment coating 506 is typically between 1 nm and 100 nm (e.g., between 1 nm and 50 nm, between 1 nm and 25 nm, or between 1 nm and 10 nm).

Referring again to FIG. 4, operation 404 of process 400 includes disposing drops of imprint resist on the pretreatment coating, such that each drop of the imprint resist covers a target area of the substrate. A volume of the imprint resist drops is typically between 0.6 pL and 30 pL, and a distance between drop centers is typically between 35 µm and 350 µm. In some cases, the volume ratio of the imprint resist to the pretreatment is between 1:1 and 15:1. In operation 406, a composite coating is formed on the substrate as each drop of the imprint resist spreads beyond its target area, forming a composite coating. As used herein, "prespreading" refers to the spontaneous spreading of the drops of imprint resist that occurs between the time when the drops initially contact the pretreatment coating and spread beyond the target areas, and the time when the template contacts the composite coating.

FIGS. 6A-6D depict top-down views of drops of imprint resist on pretreatment coating at the time of disposal of the drops on target areas, and of the composite coating before, during, and at the end of drop spreading. Although the drops are depicted in a square grid, the drop pattern is not limited to square or geometric patterns.

Figure 6A:
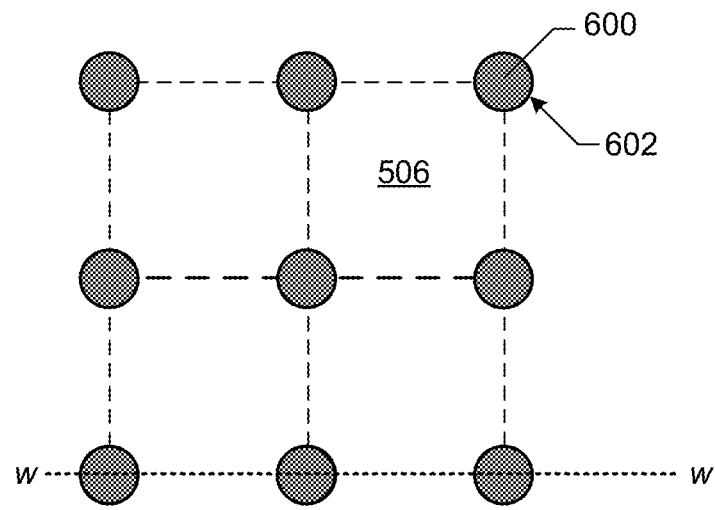
FIGS. 6A-6D depict formation of a composite coating from drops of imprint resist disposed on a substrate having a pretreatment coating.
Figure 6B:
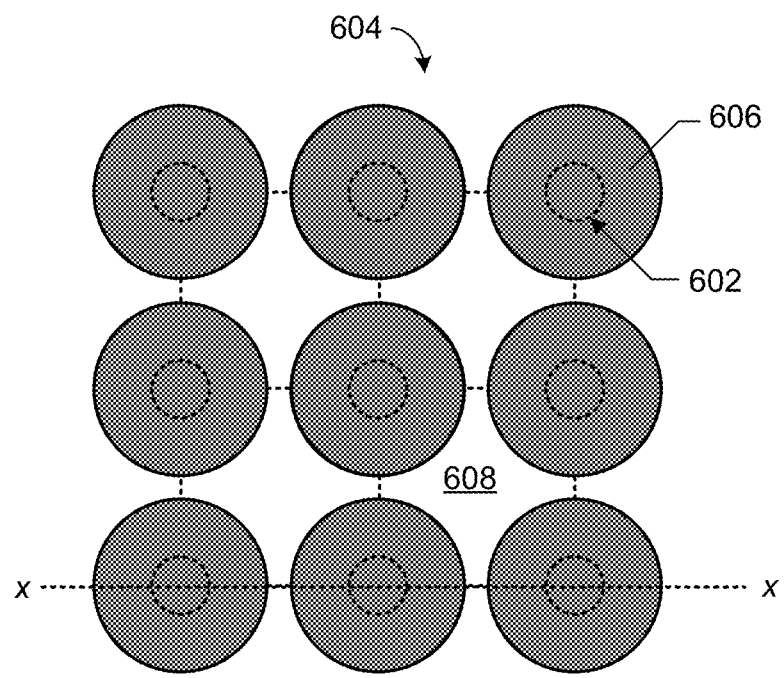

FIG. 6A depicts a top-down view of drops 600 on pretreatment coating 506 at the time when the drops are initially disposed on the pretreatment coating, such that the drops cover but do not extend beyond target areas 602. After drops 600 are disposed on pretreatment coating 506, the drops spread spontaneously to cover a surface area of the substrate larger than that of the target areas, thereby forming a composite coating on the substrate. FIG. 6B depicts a top-down view of composite coating 604 during prespreading (after some spreading of drops 600 beyond the target areas 602), and typically after some intermixing of the imprint resist and the pretreatment. As depicted, composite coating 604 is a mixture of the liquid pretreatment composition and the liquid imprint resist, with regions 606 containing a majority of imprint resist ("enriched" with imprint resist), and regions 608 containing a majority of pretreatment ("enriched" with pretreatment). As prespreading progresses, composite coating 604 may form a more homogeneous mixture of the pretreatment composition and the imprint resist.

Figure 6C:
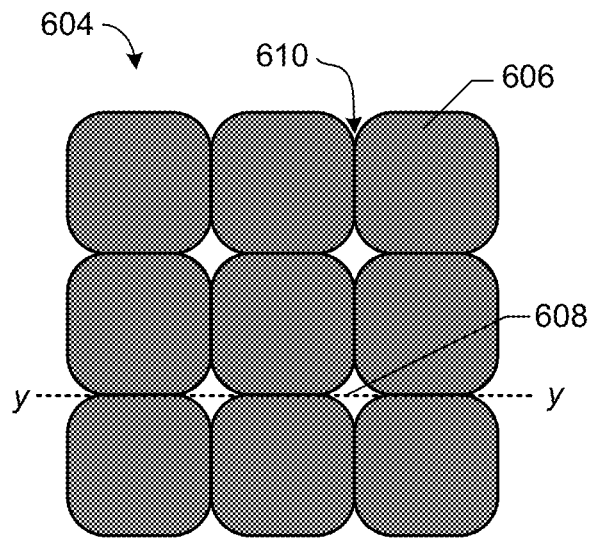
Figure 6D:
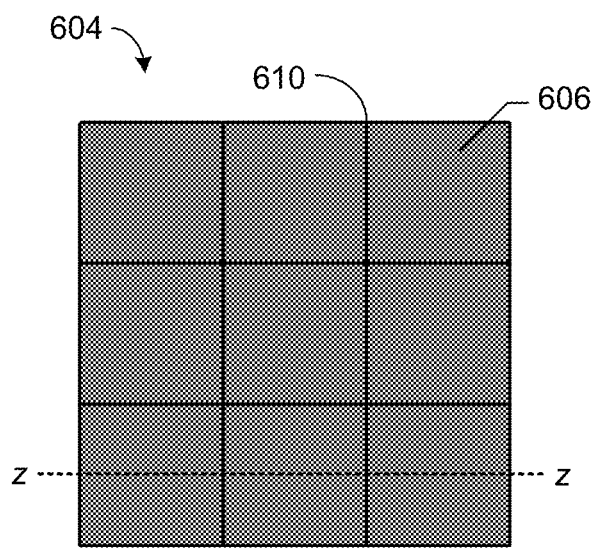

Spreading may progress until one or more of regions 606 contacts one or more adjacent regions 606. FIGS. 6C and 6D depict composite coating 604 at the end of spreading. As depicted in FIG. 6C, each of regions 606 has spread to contact each adjacent region 606 at boundaries 610, with regions 608 reduced to discrete (non-continuous) portions between regions 606. In other cases, as depicted in FIG. 6D, regions 606 spread to form a continuous layer, such that regions 608 are not distinguishable. In FIG. 6D, composite coating 604 may be a homogenous mixture of the pretreatment composition and the imprint resist.

Figure 7A:
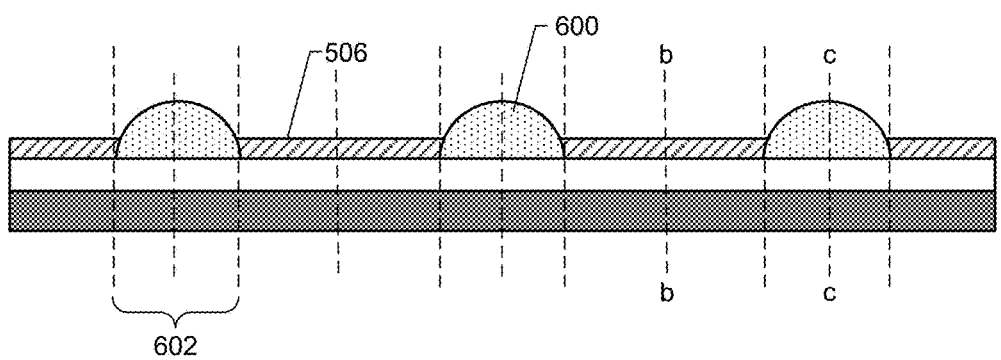
FIGS. 7A-7D depict cross-sectional views along lines w-w, x-x, y-y, and z-z of FIGS. 6A-6D, respectively.
Figure 7B:
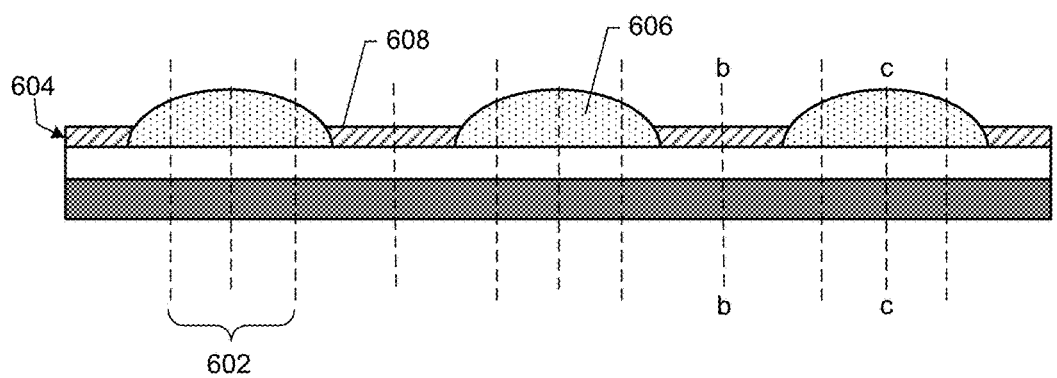
Figure 7C:
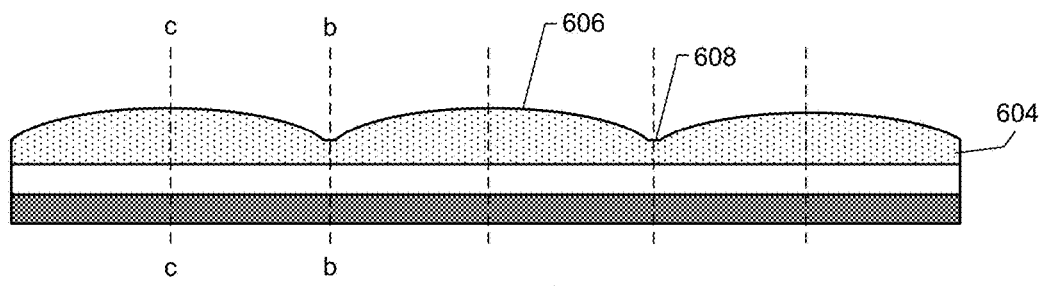
Figure 7D:
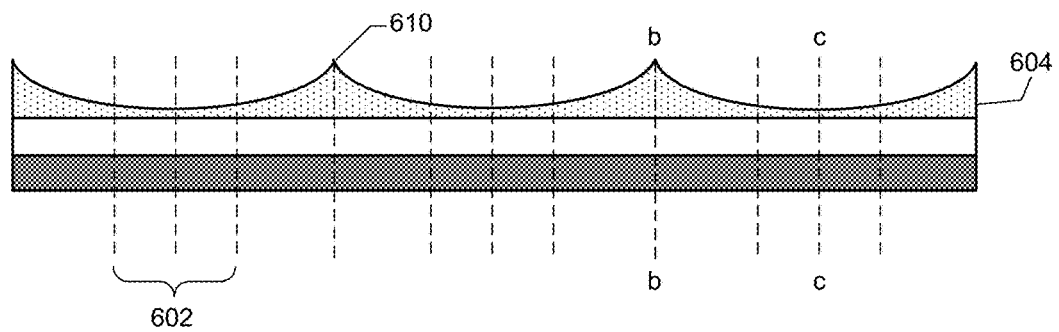

FIGS. 7A-7D are cross-sectional views along lines w-w, x-x, y-y, and z-z of FIGS. 6A-D, respectively. FIG. 7A is a cross-sectional view along line w-w of FIG. 6A, depicting drops of imprint resist 600 covering a surface area of substrate 102 corresponding to target areas 602. Each target area (and each drop as initially disposed) has a center as indicated by line c-c, and line b-b indicates a location equidistant between the centers of two target areas 602. For simplicity, drops 600 are depicted as contacting adhesion layer 502 of substrate 102, and no intermixing of the imprint resist and the pretreatment composition is depicted. FIG. 7B is a cross-sectional view along line x-x of FIG. 6B, depicting composite coating 604 with regions 608 exposed between regions 606, after regions 606 have spread beyond target areas 602. FIG. 7C is a cross-sectional view along line y-y of FIG. 6C at the end of prespreading, depicting composite coating 604 as a homogeneous mixture of the pretreatment composition and imprint resist. As depicted, regions 606 have spread to cover a greater surface of the substrate than in FIG. 7B, and regions 608 are correspondingly reduced. Regions 606 originating from drops 600 are depicted as convex, however, composite coating 604 may be substantially planar or include concave regions. In certain cases, prespreading may continue beyond that depicted in FIG. 7C, with the imprint resist forming a continuous layer over the pretreatment (with no intermixing or with full or partial intermixing). FIG. 7D is a cross-sectional view along line z-z of FIG. 6D, depicting composite coating 604 as a homogenous mixture of the pretreatment composition and the imprint resist at the end of spreading, with concave regions of the composite coating about drop centers cc meeting at boundaries 610, such that the thickness of the polymerizable coating at the drop boundaries exceeds the thickness of the composite coating of the drop centers. As depicted in FIGS. 7C and 7D, a thickness of composite coating 604 at a location equidistant between the centers of two target areas may differ from a thickness of the composite coating at the center of one of the two target areas when the composite coating is contacted with the nanoimprint lithography template.

Referring again to FIG. 4, operations 408 and 410 of process 400 include contacting the composite coating with a template, and polymerizing the composite coating to yield a nanoimprint lithography stack having a composite polymeric layer on the nanoimprint lithography substrate, respectively.

In some cases, as depicted in FIGS. 7C and 7D, composite coating 604 is a homogeneous mixture or substantially homogenous mixture (e.g., at the air-composite coating interface) at the end of prespreading (i.e., just before the composite coating is contacted with the template). As such, the template contacts a homogenous mixture, with a majority of the mixture typically derived from the imprint resist. Thus, the release properties of the imprint resist would generally govern the interaction of the composite coating with the template, as well as the separation of the polymeric layer from the template, including defect formation (or absence thereof) due to separation forces between the template and the polymeric layer.

Figure 8A:
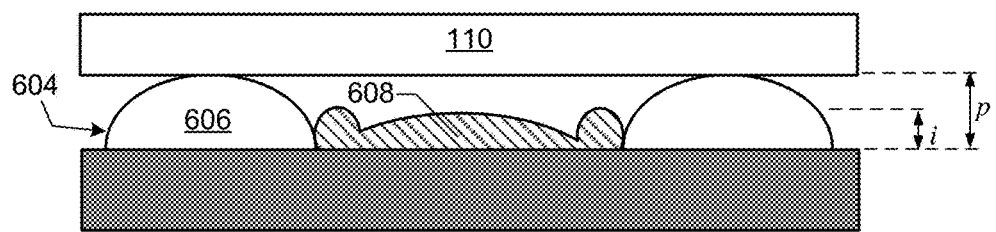
FIGS. 8A and 8B depict cross-sectional views of a pretreatment coating displaced by drops on a substrate.
Figure 8B:
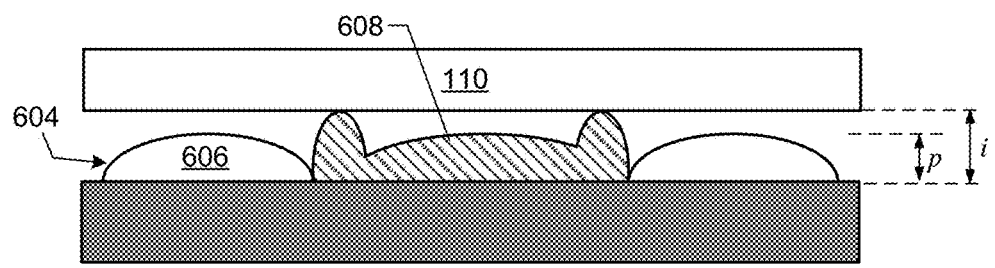

As depicted in FIGS. 8A and 8B, however, composite coating 604 may include regions 608 and 606 that are enriched with the pretreatment composition and enriched with the imprint resist, respectively, such that template 110 contacts regions of composite coating 604 having different physical and chemical properties. For simplicity, the imprint resist in regions 606 is depicted as having displaced the pretreatment coating, such that regions 606 are in direct contact with the substrate, and no intermixing is shown. Thus, the pretreatment composition in regions 608 is non-uniform in thickness. In FIG. 8A, the maximum height p of regions 606 exceeds the maximum height i of the pretreatment composition, such that template 110 primarily contacts regions 606. In FIG. 8B maximum height i of regions 608 exceeds the maximum height p of the imprint resist, such that template 110 primarily contacts regions 608. Thus, separation of template 110 from the resulting composite polymeric layer and the defect density associated therewith is nonuniform and based on the different interactions between the template and the imprint resist and between the template and the pretreatment composition. Thus, for certain pretreatment compositions (e.g., pretreatment compositions that include a single monomer or a mixture of two or more monomers, but no surfactant), it may be advantageous for the composite coating to form a homogenous mixture, or at least a substantially homogenous mixture at the gas-liquid interface at which the template contacts the composite coating.

Figure 9A:
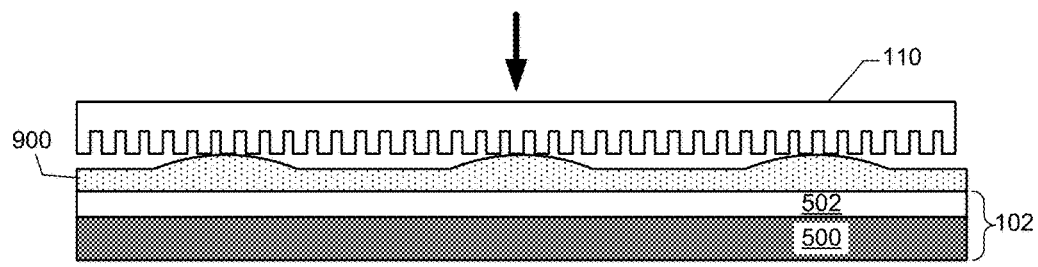
FIGS. 9A-9C depict cross-sectional views of a template in contact with a homogeneous composite coating and the resulting nanoimprint lithography stack.
Figure 9B:
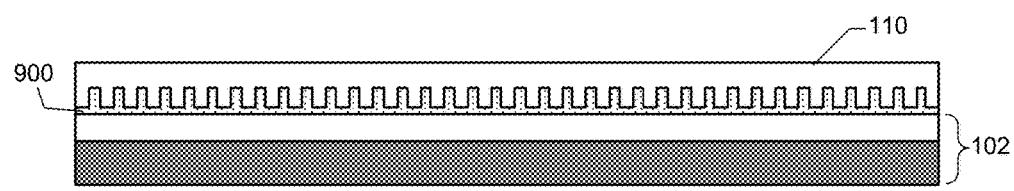
Figure 9C:
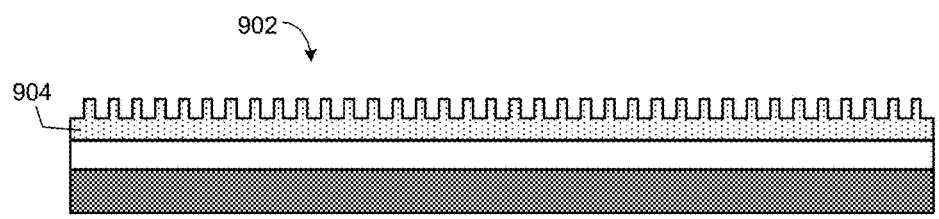
Figure 10A:
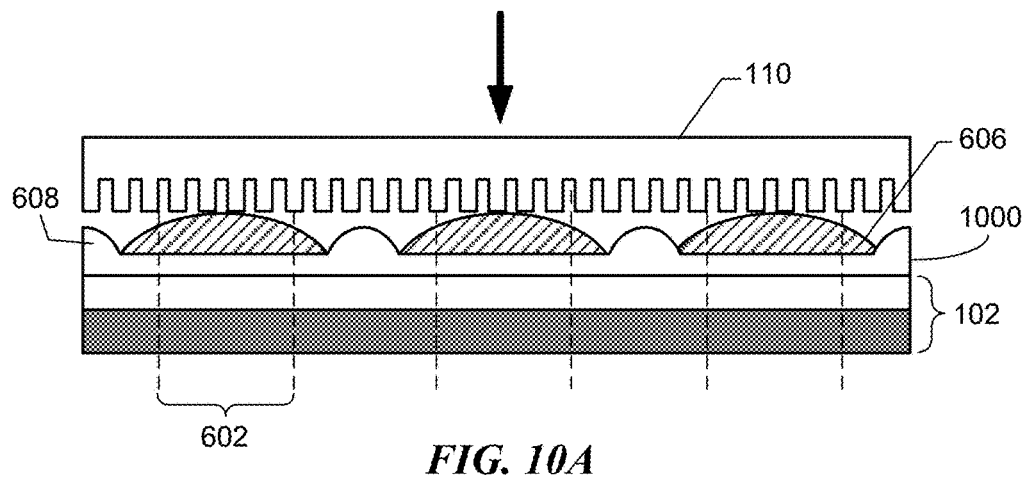
FIGS. 10A-10C depict cross-sectional views of a template in contact with an inhomogeneous composite coating and the resulting nanoimprint lithography stack.
Figure 10B:
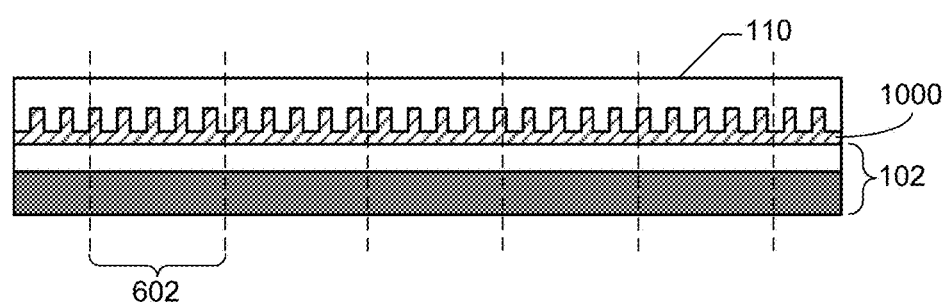
Figure 10C:
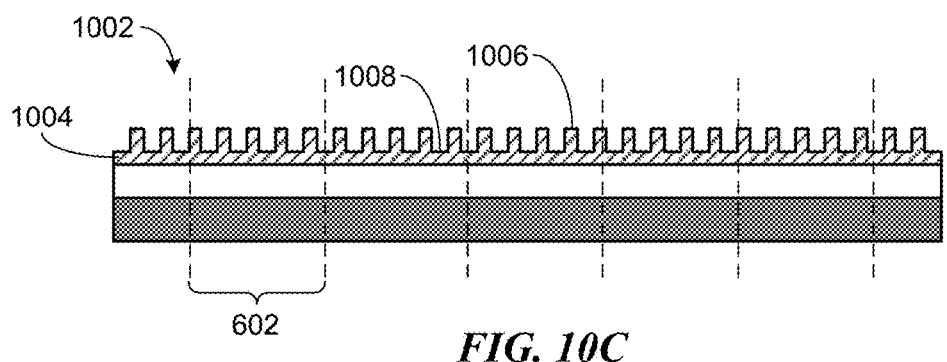

FIGS. 9A-9C and 10A-10C are cross-sectional views depicting template 110 and composite coating 604 on substrate 102 having base 500 and adhesion layer 502 before and during contact of the composite coating with the template, and after separation of the template from the composite polymeric layer to yield a nanoimprint lithography stack. In FIGS. 9A-9C, composite coating 604 is depicted as a homogeneous mixture of the pretreatment composition and the imprint resist. In FIGS. 10A-10C, composite coating 604 is depicted as an inhomogeneous mixture of the pretreatment composition and the imprint resist.

FIG. 9A depicts a cross-sectional view of initial contact of template 110 with homogeneous composite coating 900 on substrate 102. In FIG. 9B, template 110 has been advanced toward substrate 102 such that composite coating 900 fills recesses of template 110. After polymerization of composite coating 900 to yield a homogeneous polymeric layer on substrate 102, template 110 is separated from the polymeric layer. FIG. 9C depicts a cross-sectional view of nanoimprint lithography stack 902 having homogeneous composite polymeric layer 904.

FIG. 10A depicts a cross-sectional view of initial contact of template 110 with composite coating 604 on substrate 102. Inhomogeneous composite coating 1000 includes regions 606 and 608. As depicted, little or no intermixing has occurred between the imprint resist in region 606 and the pretreatment composition in region 608. In FIG. 10B, template 110 has been advanced toward substrate 102 such that composite coating 1000 fills recesses of template 110. After polymerization of composite coating 1000 to yield an inhomogeneous polymeric layer on substrate 102, template 110 is separated from the polymeric layer. FIG. 10C depicts a cross-sectional view of nanoimprint lithography stack 1002 having inhomogeneous polymeric layer 1004 with regions 1006 and 1008 corresponding to regions 606 and 608 of inhomogeneous composite coating 1000. Thus, the chemical composition of composite polymeric layer 1002 is inhomogeneous or non-uniform, and includes regions 1006 having a composition derived from a mixture enriched with the imprint resist and regions 1008 having a composition derived from a mixture enriched with the pretreatment composition. The relative size (e.g., exposed surface area, surface area of template covered, or volume) of regions 1006 and 1008 may vary based at least in part on the extent of prespreading before contact of the composite coating with the template or spreading due to contact with the template. In some cases, regions 1006 may be separated or bounded by regions 1008, such that composite polymeric layer includes a plurality of center regions separated by boundaries, with the chemical composition of the composite polymeric layer 1004 at the boundaries differing from the chemical composition of the composite polymeric layer at the interior of the center regions.

The contact of composite coating 604 with template 110 mentioned above may be carried out in an atmosphere containing a condensable gas (hereinafter, referred to as a "condensable gas atmosphere"). As used herein, the condensable gas refers to a gas that is condensed and liquefied by capillary pressure generated when the recesses of a fine pattern formed on template 110 and gaps between a mold and a substrate are filled with the gas in the atmosphere, together with the pretreatment composition and the imprint resist. In contacting the composite coating with a template, the condensable gas exists as a gas in the atmosphere before contact of the pretreatment composition and the imprint resist with template 110.

Upon contacting the composite coating with a template in the condensable gas atmosphere, the gas that fills the recesses of a fine pattern is liquefied so that a gas bubble disappears, producing excellent filling properties. The condensable gas may be dissolved in the pretreatment composition and/or the imprint resist.

The boiling point of the condensable gas is not limited as long as the temperature is equal to or lower than an ambient temperature in contacting the composite coating with a template. The boiling point is preferably −10° C. to 23° C., more preferably 10° C. to 23° C. Within this range, better filling properties are produced.

The vapor pressure of the condensable gas at an ambient temperature in contacting the composite coating with a template is not limited as long as the pressure is equal to or lower than mold pressure of imprinting in contacting the composite coating with a template. The vapor pressure is preferably 0.1 to 0.4 MPa. Within this range, better filling properties are produced. A vapor pressure larger than 0.4 MPa at an ambient temperature tends to be not sufficiently effective for the disappearance of an air bubble. On the other hand, a vapor pressure smaller than 0.1 MPa at an ambient temperature tends to require reduction in pressure and a complicated apparatus.

The ambient temperature in contacting the composite coating with a template is not limited and is preferably 20° C. to 25° C.

Specific examples of suitable condensable gases include frons including chlorofluorocarbon (CFC) such as trichlorofluoromethane, fluorocarbon (FC), hydrochlorofluorocarbon (HCFC), hydrofluorocarbon (HFC) such as 1,1,1,3,3-pentafluoropropane ($CHF_2CH_2CF_3$, HFC-245fa, PFP), and hydrofluoroether (HFE) such as pentafluoroethyl methyl ether ($CF_3CF_2OCH_3$, HFE-245mc). Among them, 1,1,1,3,3-pentafluoropropane (vapor pressure at 23° C.: 0.14 MPa, boiling point: 15° C.), trichlorofluoromethane (vapor pressure at 23° C.: 0.1056 MPa, boiling point: 24° C.), and pentafluoroethyl methyl ether are preferred from the viewpoint of excellent filling properties at an ambient temperature of 20° C. to 25° C. in contacting the composite coating with a template. Further, 1,1,1,3,3-pentafluoropropane is particularly preferred from the viewpoint of excellent safety. One type of these condensable gases may be used alone, or two or more types of these condensable gases may be used as a mixture.

These condensable gases may be used as mixtures with non-condensable gases such as air, nitrogen, carbon dioxide, helium, and argon. Helium is preferred as a non-condensable gas to be mixed with a condensable gas from the viewpoint of filling properties. Helium can penetrate mold 205. Therefore, the condensable gas is liquefied while helium penetrates the mold, when the recesses of a fine pattern formed on mold 205 in contacting the composite coating with a template are filled with the gases (condensable gas and helium) in the atmosphere, together with the pretreatment composition and/or the imprint resist.

The polymeric layer obtained by separation of the template from the composite polymeric layer has a particular pattern shape. As shown in FIG. 2, residual layer 204 may remain in a region other than the region having this formed pattern shape. In such a case, residual layer 204 present in the region to be removed in cured layer 202 having the obtained pattern shape is removed by an etching gas. As a result, a patterned cured layer having the desired pattern shape (e.g., pattern shape derived from the shape of template 110) can be obtained without the residual layer (i.e., the desired portion on the surface of substrate 102 is exposed).

In this context, examples of suitable methods for removing residual layer 204 include methods which involve removing residual layer 204 present at the recesses of cured layer 202 having a pattern shape by a technique such as etching to expose the surface of substrate 102 at the recesses in the pattern of this cured layer 202 having a pattern shape.

In the case of removing residual layer 204 present at the recesses of cured layer 202 having a pattern shape by etching, a specific method therefore is not limited, and a conventional method known in the art, for example, dry etching using an etching gas, can be used. A conventional dry etching apparatus known in the art can be used in the dry etching. An etching gas is appropriately selected according to the elemental composition of the cured layer to be subjected to this etching. For example, a halogen gas (e.g., $CF_4$, $C_2F_6$, $C_3F_8$, $CCl_2F_2$, $CCl_4$, $CBrF_3$, $BCl_3$, $PCl_3$, $SF_6$, and $Cl_2$), an oxygen atom-containing gas (e.g., $O_2$, CO, and $CO_2$), an inert gas (e.g., He, $N_2$, and Ar), or a gas such as $H_2$ or $NH_3$ can be used. These gases may be used as a mixture.

When substrate 102 (substrate to be processed) used is a substrate improved in adhesion to cured layer 202 by surface treatment such as silane coupling treatment, silazane treatment, and organic thin film formation, such a surface-treated layer can also be removed by etching following the etching of the residual layer present at the recesses of cured layer 202 having a pattern shape.

The production process described above can produce a patterned cured layer having the desired pattern shape (pattern shape derived from the shape of template 110) at the desired position without the residual layer, and can produce an article having this patterned cured layer. Substrate 102 may be further processed as described herein.

The obtained patterned cured layer can be used, for example, in semiconductor processing mentioned later or can also be used as an optical member (including use as a portion of the optical member) such as a diffraction grating or a polarizer to obtain an optical component. In such a case, an optical component having at least substrate 102 and the patterned cured layer disposed on this substrate 102 can be prepared. For a reverse tone process, a separate residual layer etch is not required. However, it is understood that the adhesion layer etch is compatible with the resist etch.

After the removal of the residual layer, the patterned cured layer 304 having no residual layer is used as a resist film in the dry etching of a portion of surface-exposed substrate 102. A conventional dry etching apparatus known in the art can be used in the dry etching. Etching gas is appropriately selected according to the elemental composition of the cured layer to be subjected to this etching and the elemental composition of substrate 102. For example, a halogen gas (e.g., $CF_4$, $C_2F_6$, $C_3F_8$, $CCl_2F_2$, $CCl_4$, $CBrF_3$, $BCl_3$, $PCl_3$, $SF_6$, and $Cl_2$), an oxygen atom-containing gas (e.g., $O_2$, CO, and $CO_2$), an inert gas (e.g., He, $N_2$, and Ar), or a gas such as $H_2$ or $NH_3$ can be used. These gases may be used as a mixture. An etching gas for the removal of the residual layer mentioned above and an etching gas for substrate processing may be the same or different.

As already mentioned, an inhomogeneous mixture of the pretreatment composition and the imprint resist may be formed in cured layer 202 having a pattern shape.

The pretreatment composition preferably has dry etching resistance approximately the same as that of the imprint resist. This allows substrate 102 to be favorably processed even in a region having a high concentration of the pretreatment composition. As a result, substrate 102 can be uniformly processed.

In addition to a series of steps (production process) mentioned above, an electronic component can be formed to yield, on substrate 102, a circuit structure based on the pattern shape derived from the shape of template 110. Thus, a circuit substrate that is used in semiconductor devices, etc., can be produced. Examples of such semiconductor devices include LSI, system LSI, DRAM, SDRAM, RDRAM, D-RDRAM, and NAND flash. This circuit substrate can also be connected to, for example, a circuit control mechanism for circuit substrates to form electronic equipment such as a display, a camera and a medical apparatus.

Likewise, the patterned cured product having no residual layer can also be used as a resist film in substrate processing by dry etching to produce an optical component.

Alternatively, a quartz substrate may be used as substrate 102, and patterned cured product 202 may be used as a resist film. In such a case, the quartz substrate can be processed by dry etching to prepare a replica of a quartz imprint mold (replica mold).

In the case of preparing a circuit substrate or an electronic component, patterned cured product 202 may be finally removed from the processed substrate, or may be configured to remain as a member constituting the device.

EXAMPLES

In the Examples below, the reported interfacial surface energy at the interface between the imprint resist and air was measured by the maximum bubble pressure method. The measurements were made using a BP2 bubble pressure tensiometer manufactured by Krüss GmbH of Hamburg, Germany. In the maximum bubble pressure method, the maximum internal pressure of a gas bubble which is formed in a liquid by means of a capillary is measured. With a capillary of known diameter, the surface tension can be calculated from the Young-Laplace equation. For the pretreatment compositions, the interfacial surface energy at the interface between the pretreatment composition and air was measured by the maximum bubble pressure method or obtained as the manufacturer's reported values.

The viscosities were measured using a Brookfield DV-II+ Pro with a small sample adapter using a temperature-controlled bath set at 23° C. Reported viscosity values are the average of five measurements.

Adhesion layers were prepared on substrates formed by curing an adhesive composition made by combining about 77 g ISORAD 501, about 22 g CYMEL 303ULF, and about 1 g TAG 2678, introducing this mixture into approximately 1900 grams of PM Acetate. The adhesive composition was spun onto a substrate (e.g., a silicon wafer) at a rotational velocity between 500 and 4,000 revolutions per minute so as to provide a substantially smooth, if not planar layer with uniform thickness. The spun-on composition was exposed to thermal actinic energy of 160° C. for approximately two minutes. The resulting adhesion layers were about 3 nm to about 4 nm thick.

In Comparative Example 1 and Examples 1-3, an imprint resist with a surface tension of 33 mN/m at an air/imprint resist interface was used to demonstrate spreading of the imprint resist on various surfaces. The imprint resist was a polymerizable composition including about 45 wt % monofunctional acrylate (e.g., isobornyl acrylate and benzyl acrylate), about 48 wt % difunctional acrylate (e.g., neopentyl glycol diacrylate), about 5 wt % photoinitiator (e.g., TPO and 4265), and about 3 wt % surfactant (e.g., a mixture of X—R—(OCH$_2$CH$_2$)OH, where R=alkyl, aryl, or poly(propylene glycol), X=H or —(OCH$_2$CH$_2$)OH, and n is an integer (e.g., 2 to 20, 5 to 15, or 10-12) (e.g., X=—(OCH$_2$CH$_2$)OH, R=poly(propylene glycol), and n=10-12) and a fluorosurfactant, where X=perfluorinated alkyl.

Figure 11:
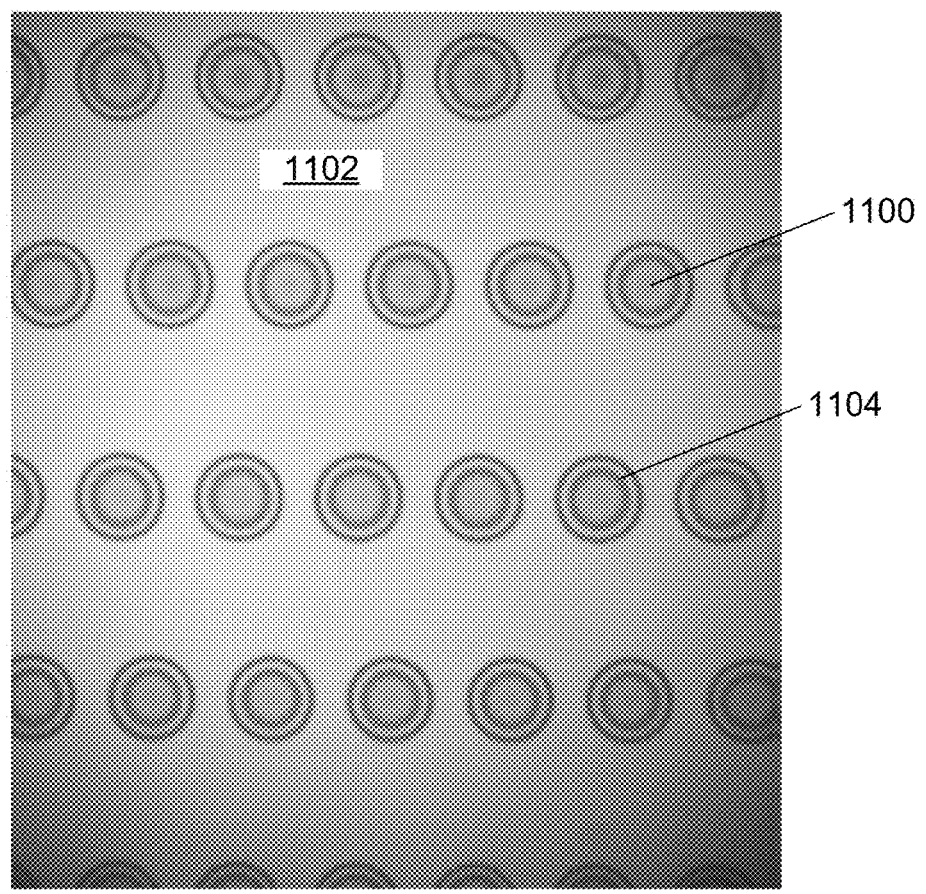
FIG. 11 is an image of drops of an imprint resist after spreading on an adhesion layer of a substrate without a pretreatment coating, corresponding to Comparative Example 1.

In Comparative Example 1, the imprint resist was disposed directly on the adhesion layer of a nanoimprint lithography substrate. FIG. 11 is an image of drops 1100 of the imprint resist on the adhesion layer 1102 of a substrate 1.7 sec after dispensation of the drops in a lattice pattern was initiated. As seen in the image, drops 1100 have spread outward from the target areas on the substrate. However, spreading beyond the target area was limited, and the area of the exposed adhesion layer 1102 exceeded that of drops 1100. Rings visible in this and other images, such as ring 1104, are Newton interference rings, which indicate a difference in thickness in various regions of the drop. Resist drop size was approximately 2.5 pL. FIG. 11 has a 2×7 (pitch) interleaved lattice of drops (e.g., 2 units in the horizontal direction, with 3.5 units between the lines). Each following line shifted 1 unit in the horizontal direction.

Figure 12:
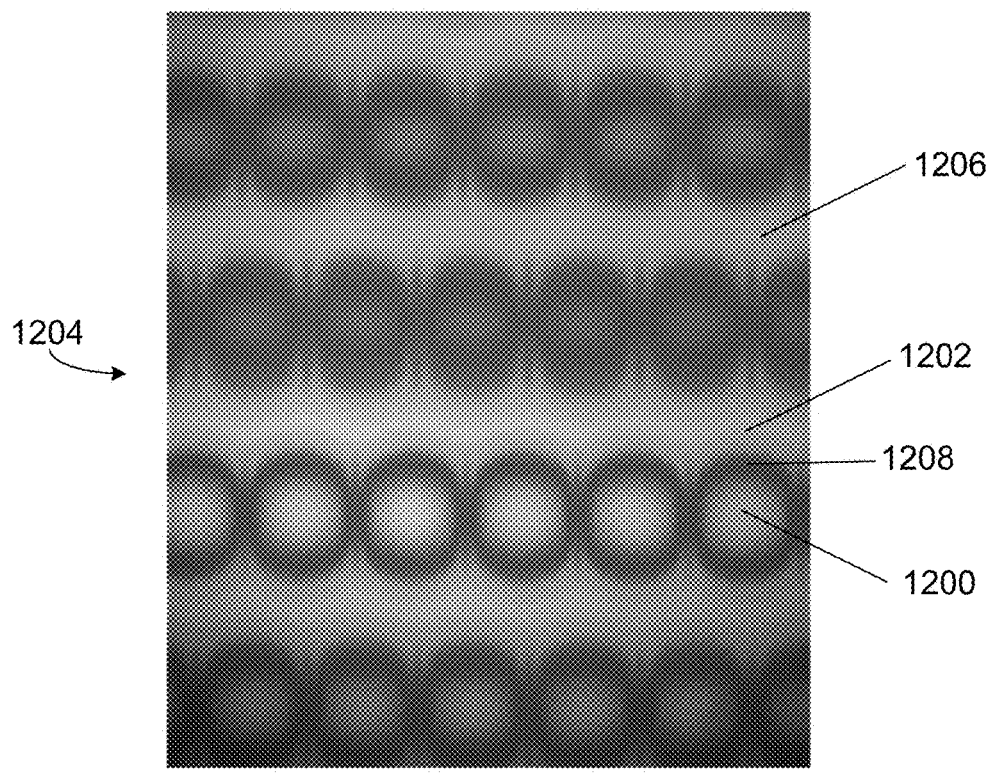
FIG. 12 is an image of drops of an imprint resist after spreading on a pretreatment coating as described in Example 1.
Figure 13:
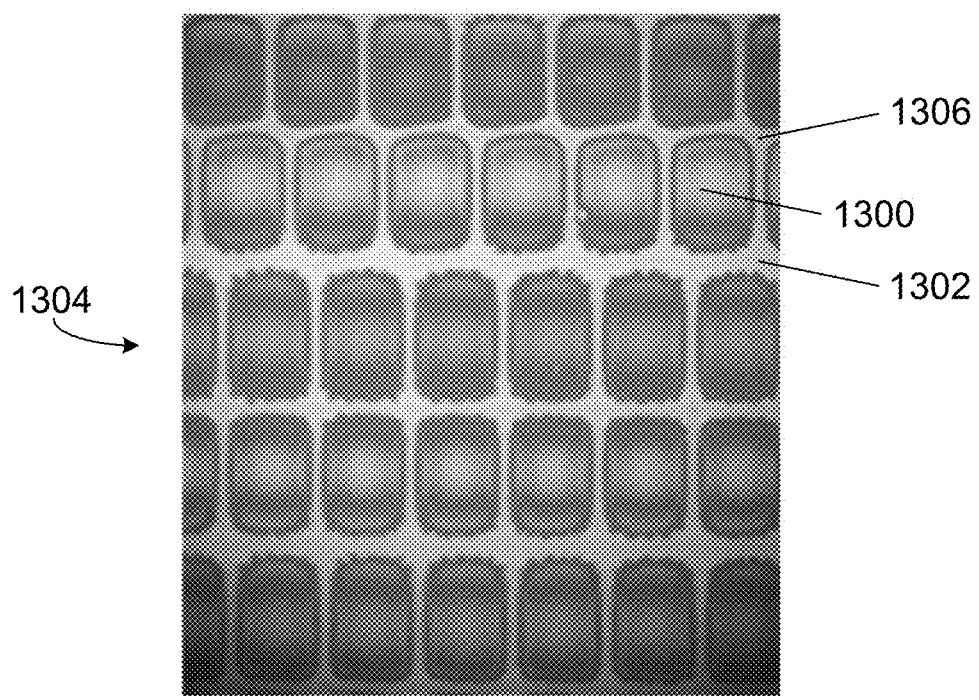
FIG. 13 is an image of drops of an imprint resist after spreading on a pretreatment coating as described in Example 2.
Figure 14:
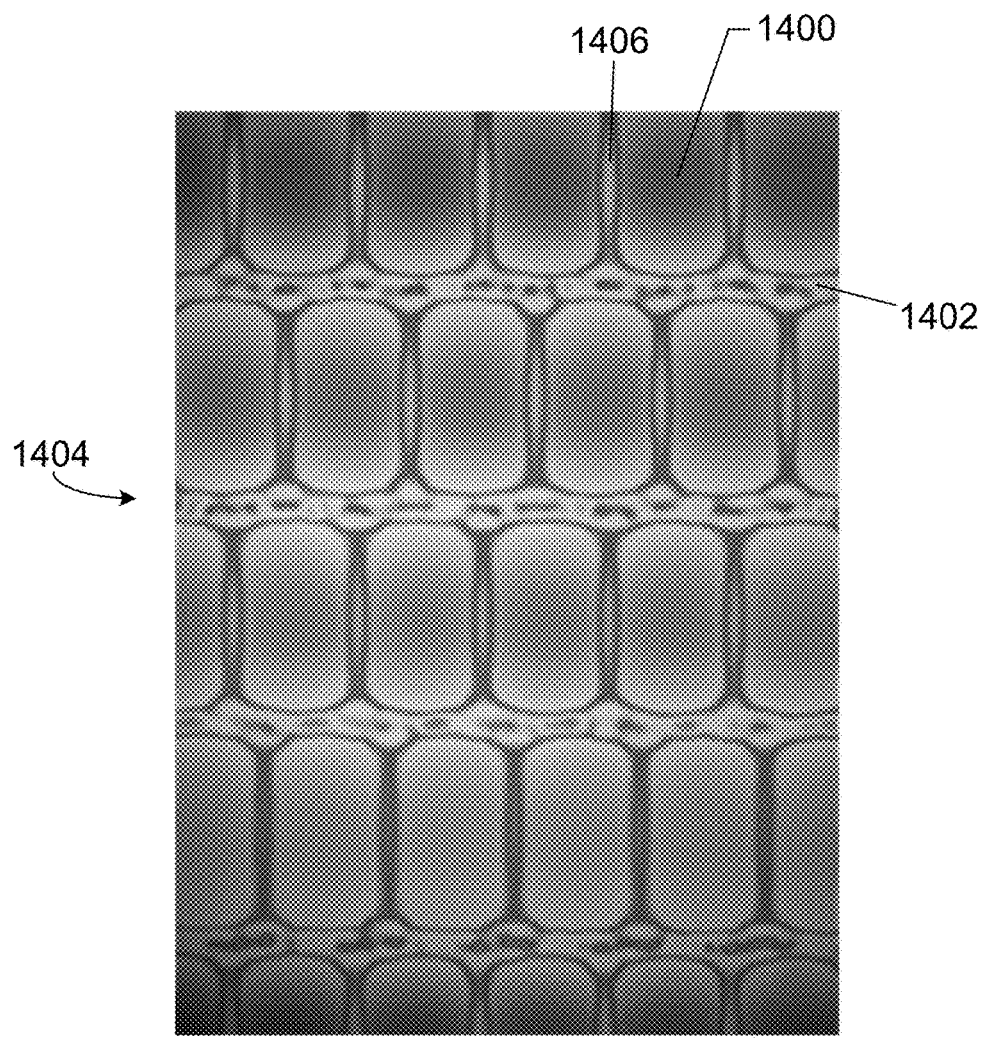
FIG. 14 is an image of drops of an imprint resist after spreading on a pretreatment coating as described in Example 3.

In Examples 1-3, pretreatment compositions A-C, respectively, were disposed on a nanoimprint lithography substrate to form a pretreatment coating. Drops of the imprint resist were disposed on the pretreatment coatings. FIGS. 12-14 show images of the composite coating after dispensation of drops of the imprint resist was initiated. Although intermixing occurs between the pretreatment composition and imprint resist in these examples, for simplicity, the drops of imprint resist and pretreatment coating are described below without reference to intermixing. The pretreatment composition was disposed on a wafer substrate via spin-on coating. More particularly, the pretreatment composition was dissolved in PGMEA (0.3 wt % pretreatment composition/99.7 wt % PGMEA) and spun onto the wafer substrate. Upon evaporation of the solvent, the typical thickness of the resultant pretreatment coating on the substrate was in the range from 5 nm to 10 nm (e.g., 8 nm). Resist drop size was approximately 2.5 pL in FIGS. 12-14. FIGS. 12 and 14 have a 2×7 (pitch) interleaved lattice of drops (e.g., 2 units in the horizontal direction, with 3.5 units between the lines). Each following line shifted 1 unit in the horizontal direction. FIG. 13 shows a 2×6 (pitch) interleaved lattice of drops. The pitch value was 84.5 μm. The ratios of the volumes of resist to the pretreatment layer were in the range of 1 to 15 (e.g., 6-7).

Table 1 lists the surface tension (air/liquid interface) for the pretreatment compositions A-C and the imprint resist used in Examples 1-3.

TABLE 1

Surface Tension for Pretreatment Compositions

| Example | Pretreatment composition | Pretreatment surface tension (mN/m) | Imprint resist surface tension (mN/m) | Difference in surface tension (mN/m) |
|---|---|---|---|---|
| 1 | A (Sartomer 492) | 34 | 33 | 1 |
| 2 | B (Sartomer 351HP) | 36.4 | 33 | 3.1 |
| 3 | C (Sartomer 399LV) | 39.9 | 33 | 6.9 |

In Example 1 (see Table 1), drops of the imprint resist were disposed on a substrate having a coating of pretreatment composition A (Sartomer 492 or "SR492"). SR492, available from Sartomer, Inc. (Pennsylvania, US), is propoxylated (3) trimethylolpropane triacrylate (a multifunctional acrylate). FIG. 12 shows an image of drops 1200 of the imprint resist on pretreatment coating 1202 and the resulting composite coating 1204 1.7 seconds after dispensation of the discrete portions in an interleaved lattice pattern was initiated. In this example, the drop retains its spherical cap-like shape and the spreading of the imprint resist is limited. As seen in FIG. 12, while spreading of the drops 1200 exceeds that of the imprint resist on the adhesion layer in Comparative Example 1, the drops remain separated by pretreatment coating 1202, which forms boundaries 1206 around the drops. Certain components of the imprint resist spread beyond the drop centers, forming regions 1208 surrounding drops 1200. Regions 1208 are separated by pretreatment coating 1202. The limited spreading is attributed at least in part to the small difference in surface tension (1 mN/m) between pretreatment composition A and the imprint resist, such that there is no significant energy advantage for spreading of the drops. Other factors, such as friction, are also understood to influence the extent of spreading.

In Example 2 (see Table 1), drops of the imprint resist were disposed on a substrate having a coating of pretreatment composition B (Sartomer 351HP or "SR351HP"). SR351HP, available from Sartomer, Inc. (Pennsylvania, US), is trimethylolpropane triacrylate (a multifunctional acrylate). FIG. 13 shows images of drops 1300 of the imprint resist on pretreatment coating 1302 and the resulting composite coating 1304 1.7 sec after dispensation of the drops in a square lattice pattern was initiated. After 1.7 sec, drops 1300 cover the majority of the surface area of the substrate, and are separated by pretreatment coating 1302, which forms boundaries 1306 around the drops. Drops 1300 are more uniform than drops 1200 of Example 1, and thus significant improvement is observed over the spreading in Example 1. The greater extent of spreading is attributed at least in part to the greater difference in surface tension (3.1 mN/m) between pretreatment composition B and the imprint resist than pretreatment A and the imprint resist of Example 1.

In Example 3 (see Table 1), drops of the imprint resist were disposed on a substrate having a coating of pretreatment composition C (Sartomer 399LV or "SR399LV"). SR399LV, available from Sartomer, Inc. (Pennsylvania, US), is dipentaerythritol pentaacrylate (a multifunctional acrylate). FIG. 14 shows an image of drops 1400 of the imprint resist on pretreatment coating 1402 and the resulting composite coating 1404 1.7 sec after dispensation of the drops in a triangular lattice pattern was initiated. As seen in FIG. 14, drops 1400 are separated at boundaries 1406 by pretreatment coating 1402. However, most of the imprint resist is accumulated at the drop boundaries, such that most of the polymerizable material is at the drop boundaries, and the drop centers are substantially empty. The extent of spreading is attributed at least in part to the large difference in surface tension (6.9 mN/m) between pretreatment composition C and the imprint resist.

Figure 15:
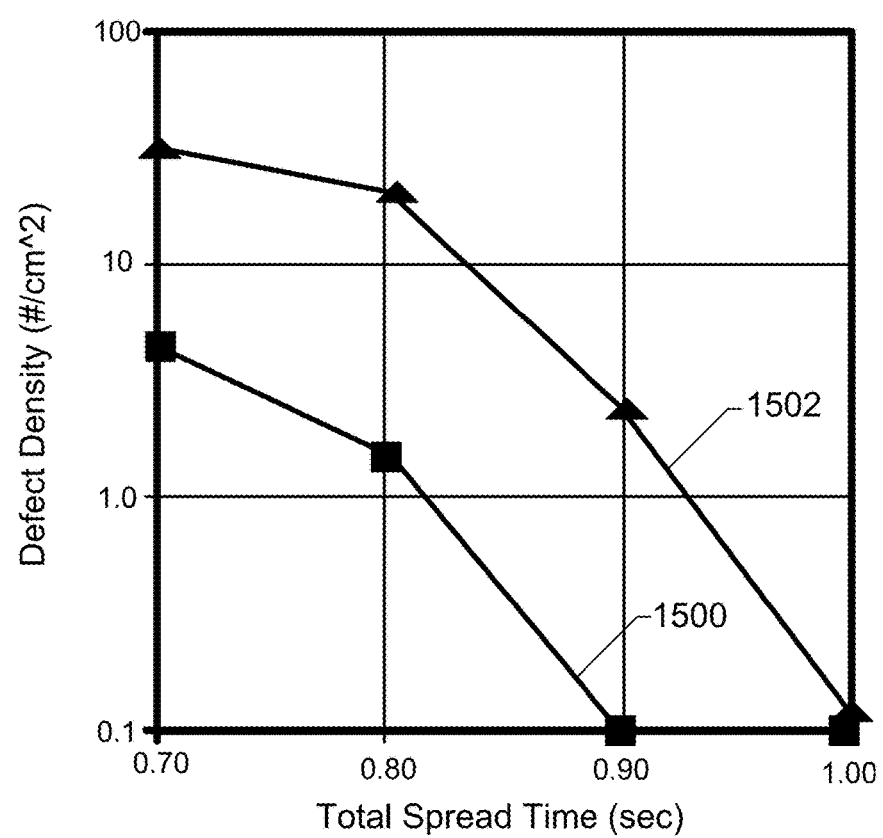
FIG. 15 shows defect density as a function of prespreading time for the imprint resist and pretreatment of Example 2.

Defect density was measured as a function of prespreading time for the imprint resist of Examples 1-3 and pretreatment composition B of Example 2. FIG. 15 shows defect density (voids) due to non-filling of the template. Plot 1500 shows defect density (number of defects per $cm^2$) as a function of spread time (sec) for 28 nm line/space pattern regions, with the defect density approaching 0.1/$cm^2$ at 0.9 sec. Plot 1502 shows defect density (number of defects per $cm^2$) as a function of spread time (sec) over the whole field having a range of feature sizes with the defect density approaching 0.1/$cm^2$ at 1 sec. By way of comparison, with no pretreatment, a defect density approaching 0.1/$cm^2$ is typically achieved for the whole field at a spread time between 2.5 sec and 3.0 sec.

Figure 16:
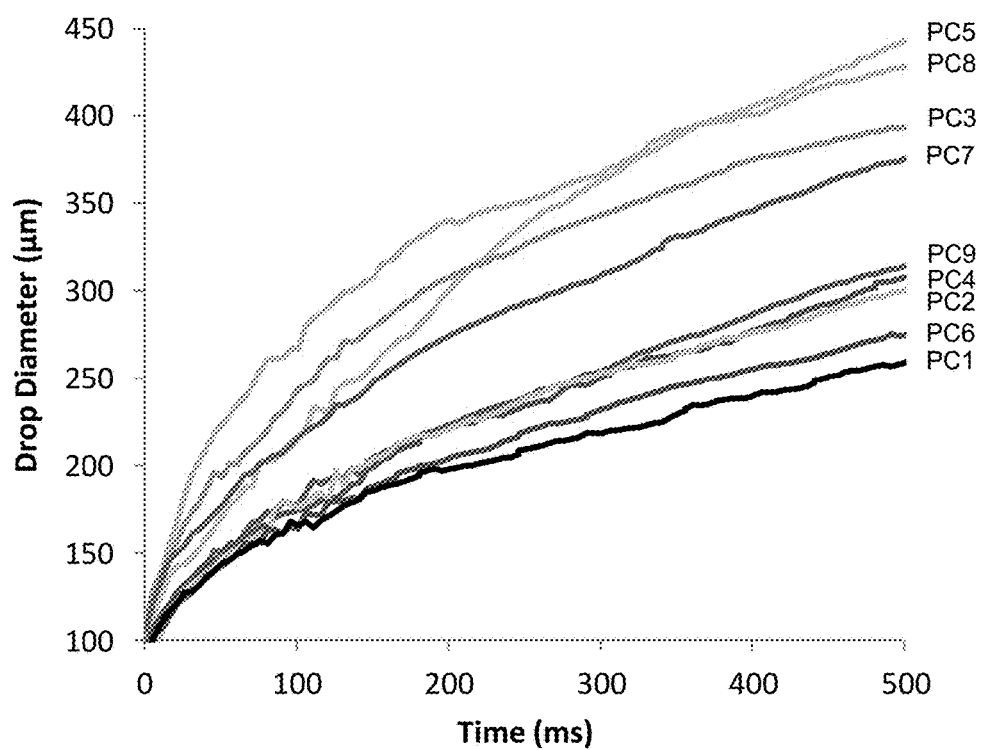
FIG. 16 shows drop diameter versus time for spreading pretreatment compositions.

Properties of pretreatment compositions PC1-PC9 are shown in Table 2. A key for PC1-PC9 is shown below. Viscosities were measured as described herein at a temperature of 23° C. To calculate the diameter ratio (Diam. Ratio) at 500 ms as shown in Table 2, drops of imprint resist (drop size ~25 pL) were allowed to spread on a substrate coated with a pretreatment composition (thickness of about 8 nm to 10 nm) on top of an adhesion layer, and the drop diameter was recorded at an elapsed time of 500 ms. The drop diameter with each pretreatment composition was divided by the drop diameter of the imprint resist on an adhesion layer with no pretreatment composition at 500 ms. As shown in Table 2, the drop diameter of the imprint resist on PC1 at 500 ms was 60% more than the drop diameter of imprint resist on an adhesion layer with no pretreatment coating. FIG. 16 shows drop diameter (μm) as a function of time (ms) for pretreatment compositions PC1-PC9. Relative etch resistance is the Ohnishi parameter of each pretreatment composition divided by the Ohnishi parameter of the imprint resist. Relative etch resistance of PC1-PC9 (the ratio of etch resistance of the pretreatment composition to the etch resistance of the imprint resist) is shown in Table 2.

TABLE 2

Properties of Pretreatment Compositions PC1-PC9

| Pretreatment Composition | Surface Tension (mN/m) | Viscosity (cP) at 23° C. | Diam. Ratio at 500 ms | Rel. Etch Resistance |
|---|---|---|---|---|
| PC1 | 36.4 ± 0.1 | 111 ± 1 | 1.59 | 1.3 |
| PC2 | 37.7 ± 0.1 | 66.6 ± 0.3 | 1.86 | 1.5 |
| PC3 | 33.9 ± 0.1 | 15.5 ± 0.1 | 2.46 | 1.1 |
| PC4 | 41.8 ± 0.1 | 64.9 ± 0.3 | 1.92 | 1.9 |
| PC5 | 38.5 ± 0.3 | 18.4 ± 0.1 | 2.73 | 1.7 |
| PC6 | NA | NA | 1.75 | 0.9 |
| PC7 | 35.5 ± 0.3 | 8.7 ± 0.1 | 2.36 | 1.1 |
| PC8 | 39.3 ± 0.1 | 10.0 ± 0.1 | 2.69 | 0.9 |
| PC9 | 38.6 ± 0.1 | 143 ± 1 | 1.95 | 0.9 |
| Imprint Resist | 33 | | 1.00 | 1.0 |

PC1: trimethylolpropane triacrylate (Sartomer)
PC2: trimethylolpropane ethoxylate triacrylate, n~1.3 (Osaka Organic)
PC3: 1,12-dodecanediol diacrylate
PC4: poly(ethylene glycol) diacrylate, Mn, avg = 575 (Sigma-Aldrich)
PC5: tetraethylene glycol diacrylate (Sartomer)
PC6: 1,3-adamantanediol diacrylate
PC7: nonanediol diacrylate
PC8: m-xylylene diacrylate
PC9: tricyclodecane dimethanol diacrylate (Sartomer)

Pretreatment compositions PC3 and PC9 were combined in various weight ratios to yield pretreatment compositions PC10-PC13 having the weight ratios shown in Table 3. Comparison of properties of PC3 and PC9 with mixtures formed therefrom revealed synergistic effects. For example, PC3 has relatively low viscosity and allows for relatively fast template filling, but has relatively poor etch resistance. In contrast, PC9 has relatively good etch resistance and film stability (low evaporative loss), but is relatively viscous and demonstrates relatively slow template filling. Combinations of PC3 and PC9, however, resulted in pretreatment compositions with a combination of advantageous properties, including relatively low viscosity, relatively fast template filling, and relatively good etch resistance. For example, a pretreatment composition having 30 wt % PC3 and 70 wt % PC9 was found to have a surface tension of 37.2 mN/m, a diameter ratio of 1.61, and an Ohnishi parameter of 3.5.

TABLE 3

Composition of Pretreatment Compositions PC10-PC13

| Pretreatment Composition | PC3 (wt %) | PC9 (wt %) |
|---|---|---|
| PC10 | 25 | 75 |
| PC11 | 35 | 65 |
| PC12 | 50 | 50 |
| PC13 | 75 | 25 |

Figure 17A:
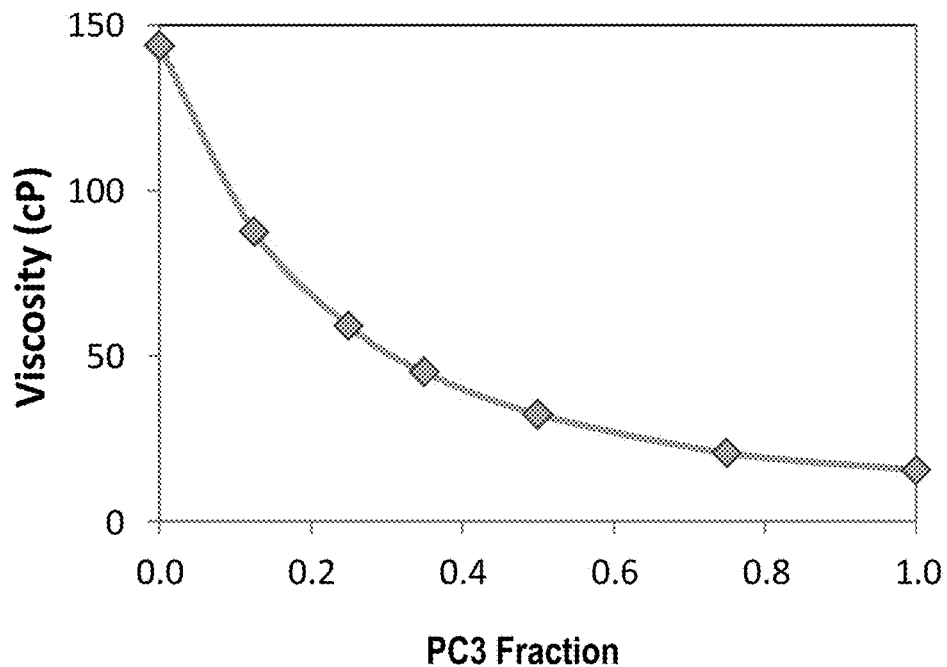
FIG. 17A shows viscosity as a function of fractional composition of one component in a two-component pretreatment composition.
Figure 17B:
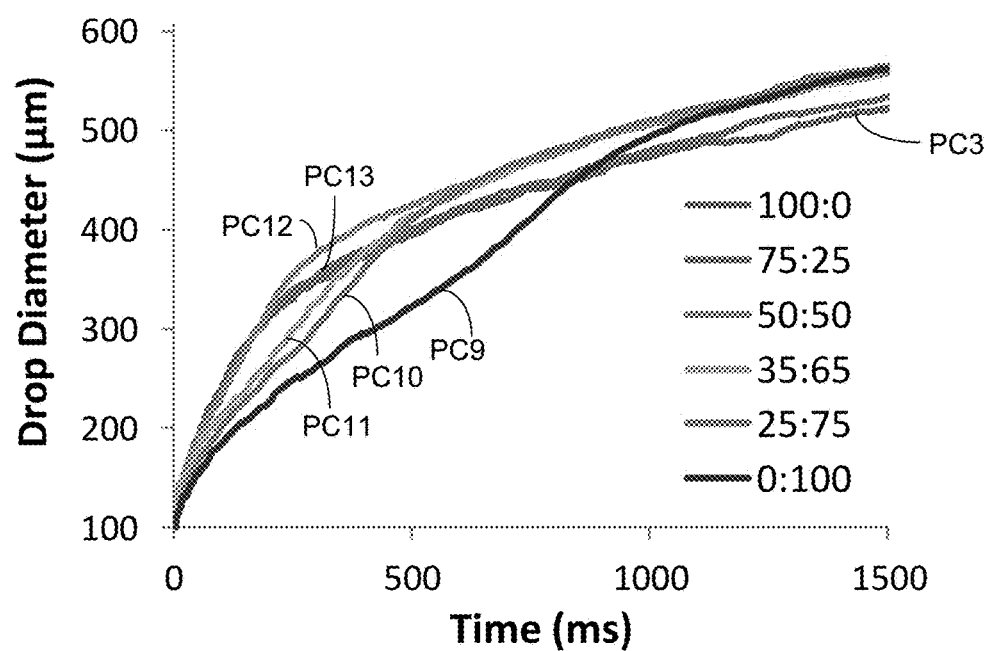
FIG. 17B shows drop diameter versus time for various ratios of components in a two-component pretreatment composition.
Figure 17C:
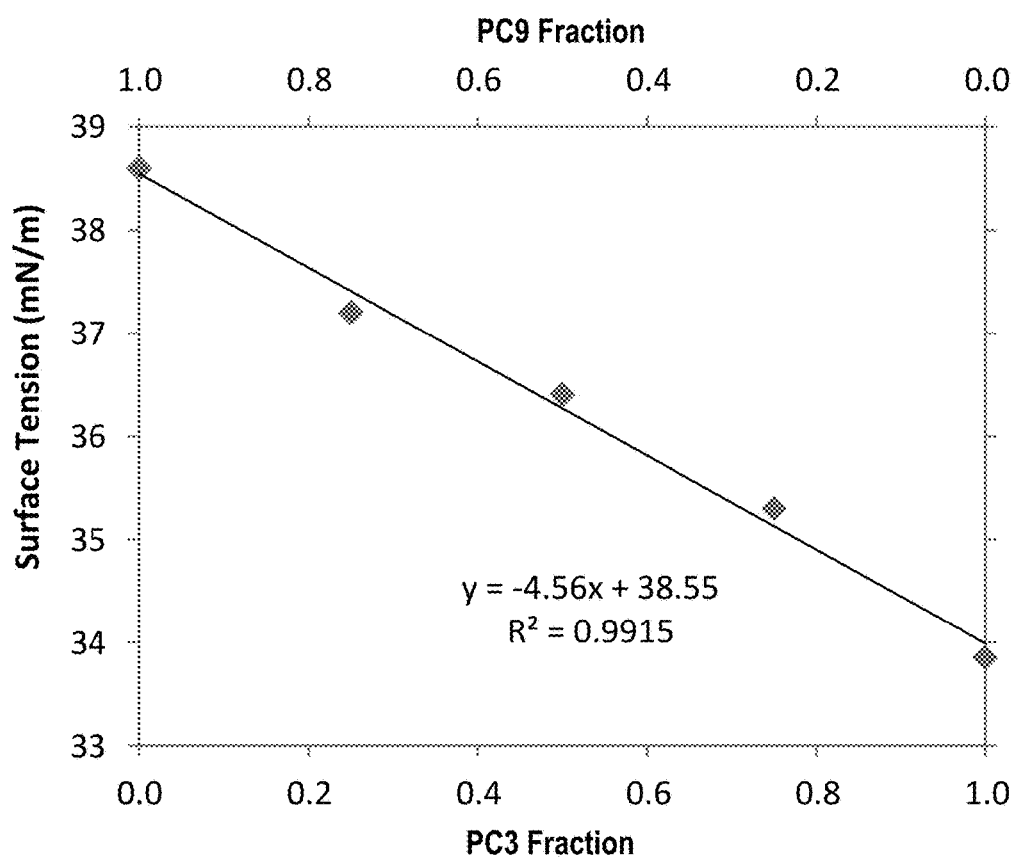
FIG. 17C shows surface tension of a two-component pretreatment composition versus fraction of one component in the two-component pretreatment composition.

FIG. 17A shows a plot of viscosity for pretreatment compositions including various ratios of PC3 and PC9 (i.e., from 100 wt % PC3 to 100 wt % PC9). FIG. 17B shows drop diameter (measured as described with respect to Table 2) for PC3, PC13, PC12, PC11, PC10, and PC9. FIG. 17C shows surface tension (mN/m) versus fraction of PC3 and PC9.

Figure 18A:
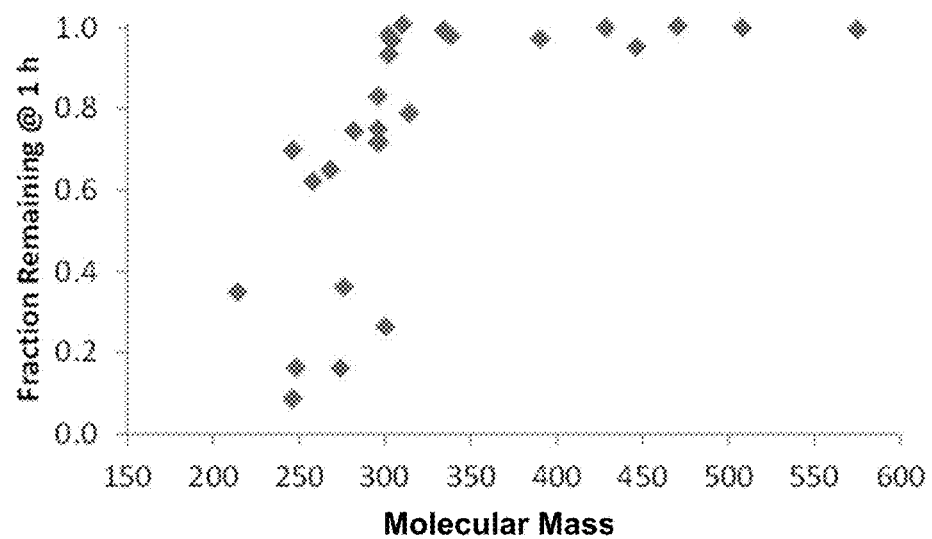
FIGS. 18A and 18B are plots of fractional coating thickness 1 hour and 24 hours, respectively, after a monomer coating is cast on a substrate.
Figure 18B:
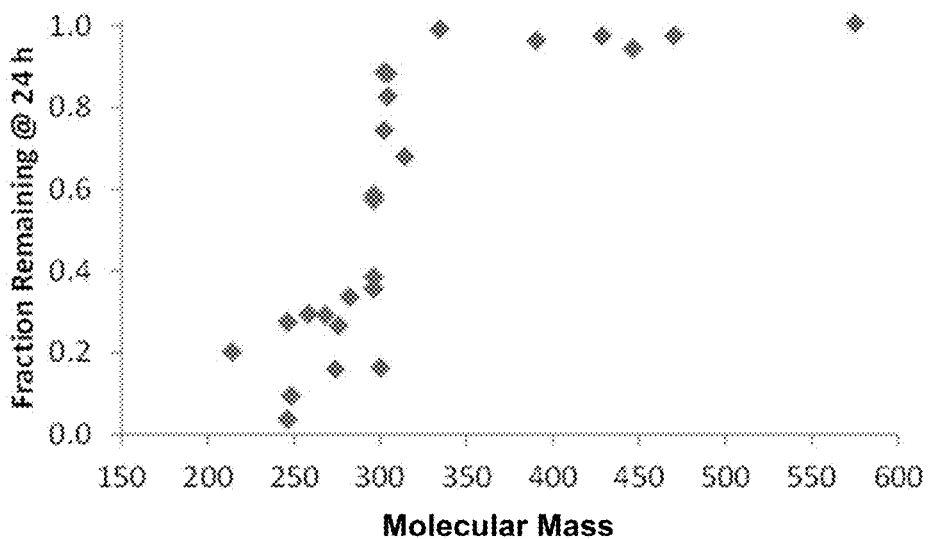

The evaporation rate of monomers was tested to determine a minimum molecular mass for achieving stable films on a time scale relevant to high volume nanoimprint lithography applications. Films of various monomers were spin-cast on a substrate to achieve a starting thickness of about 30 nm. FIG. 18A shows fractional film thickness remaining one hour after casting versus molecular mass for various monomers. As shown in FIG. 18A, monomers with a molecular mass greater than about 275, and especially monomers with a molecular mass greater than about 300, have good stability for an hour. A similar trend is seen in FIG. 18B, which shows fractional film thickness remaining 24 hours after casting versus molecular mass.

Figure 19:
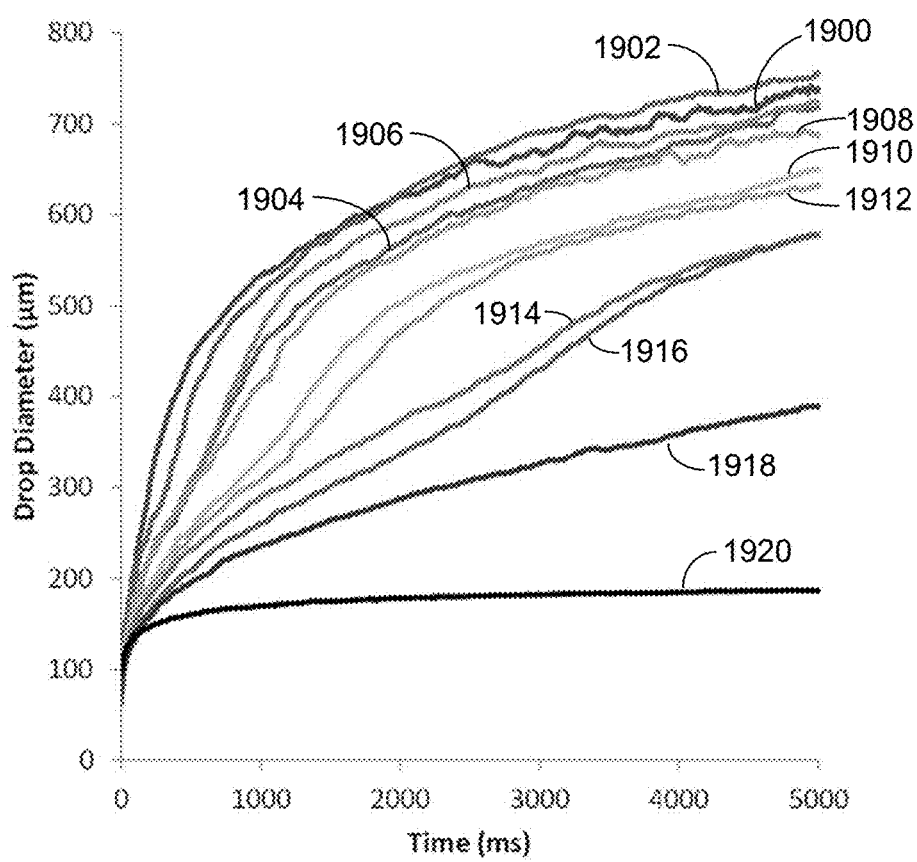
FIG. 19 shows plots of drop diameter versus time for various monomers disposed dropwise on a substrate.

In contrast to the relationship between vapor pressure and molecular mass, lower molecular mass generally corresponds to lower viscosity. To determine a maximum molecular mass corresponding to an upper limit of acceptable spreading, the spreading performance of an imprint resist on various monomers in a range of viscosities and each having a surface energy of at least 37 mN/m was measured. For this example, a minimum surface energy of 37 mN/m was selected to ensure enhanced spreading of the imprint resist on the monomer relative to spreading of the imprint resist on the substrate in the absence of a pretreatment composition. Drops of imprint resist described with respect to Examples 1-3 were disposed on thin films of the various monomers and the rate and extent of spreading were measured. The volume of each drop was about 25 pL, and the resulting film thickness was about 7 nm. FIG. 19 shows plots of drop diameter (μm) versus time (ms) for monomers having a range of viscosities, with plots 1900-1918 corresponding to the monomers listed in Table 4 (viscosity measured at 23° C.). Plot 1920 shows spreading of the imprint resist on the substrate in the absence of a pretreatment composition. From FIG. 19, it can be seen that viscosity has a large effect on the initial slope of the curves, with monomers having lower viscosities spreading faster than monomers having higher viscosities.

TABLE 4

Properties of monomers from FIG. 19.

| Plot | Monomer | Manufacturer | Product | Measured Viscosity (cP) | Surface Tension (mN/m) |
|---|---|---|---|---|---|
| 1900 | Tetraethylene glycol diacrylate | Sartomer | SR268 | 18 | 38.5 |
| 1902 | Methoxy polyethylene glycol (350) monoacrylate | Sartomer | SR551 | 27 | 39.3 |
| 1904 | Methoxy polyethylene glycol (550) monoacrylate | Sartomer | SR553 | 59 | 37.5 |
| 1906 | Poly(ethylene glycol) diacrylate (Mn, avg = 575) | Sigma-Aldrich | 437441 | 65 | 41.8 |
| 1908 | Trimethylolpropane ethoxylate triacrylate (n~1.3) | Osaka Organic | Viscoat 360 | 67 | 37.7 |
| 1910 | Trimethylolpropane ethoxylate triacrylate (n~3) | Sigma-Aldrich | 412171 | 140 | 39.1 |
| 1912 | Trimethylolpropane ethoxylate triacrylate (n~5) | Sartomer | SR9035 | 197 | 41.2 |
| 1914 | Pentaerythritol triacrylate | Sartomer | SR444 | 563 | 38.2 |
| 1916 | Ethoxylated 10 bisphenol A diacrylate | Sartomer | SR602 | 755 | 43.5 |
| 1918 | Dipentaerythritol pentaacrylate | Sartomer | SR399LV | 8744 | 40.2 |

Figure 20:
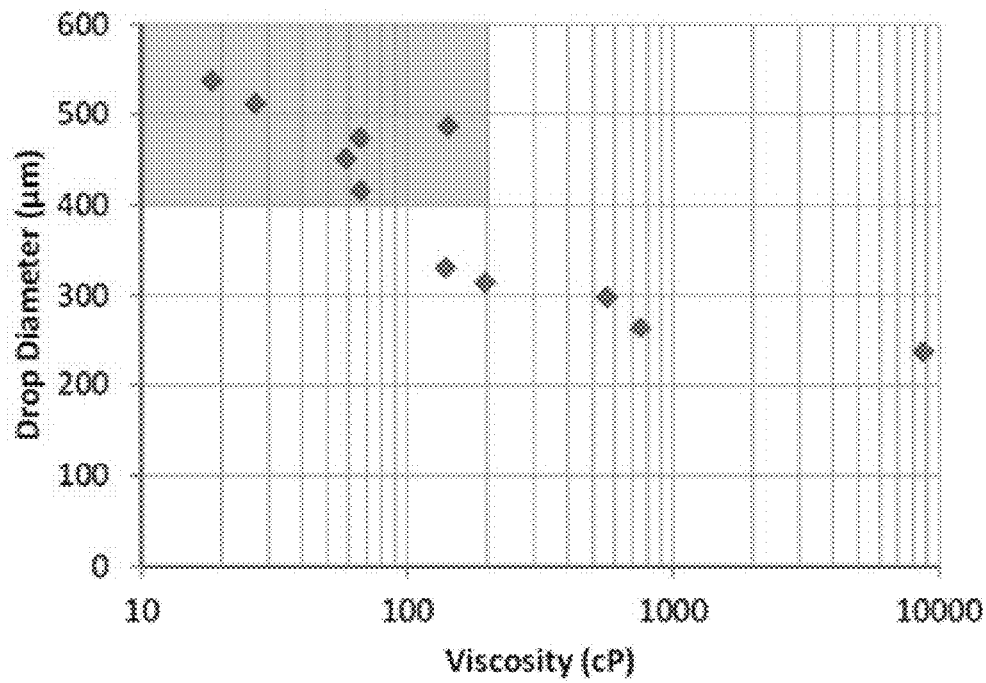
FIG. 20 shows drop diameter versus viscosity for various monomers 1000 ms after dispensation on a substrate.

FIG. 20 shows drop diameter at 1000 ms versus viscosity at 23° C. for the monomers of plots 1900-1920 of FIG. 19. As evident from FIG. 20, monomers having a viscosity of below 100 cP demonstrate consistently fast spreading. Between 100 cP and 500 cP, there is some variation in the extent of spreading. Based on the need to maximize spreading for better filling performance, it was determined that suitable monomers have a viscosity of less than 500 cP, less than 200 cP, or less than 100 cP.

Figure 21:
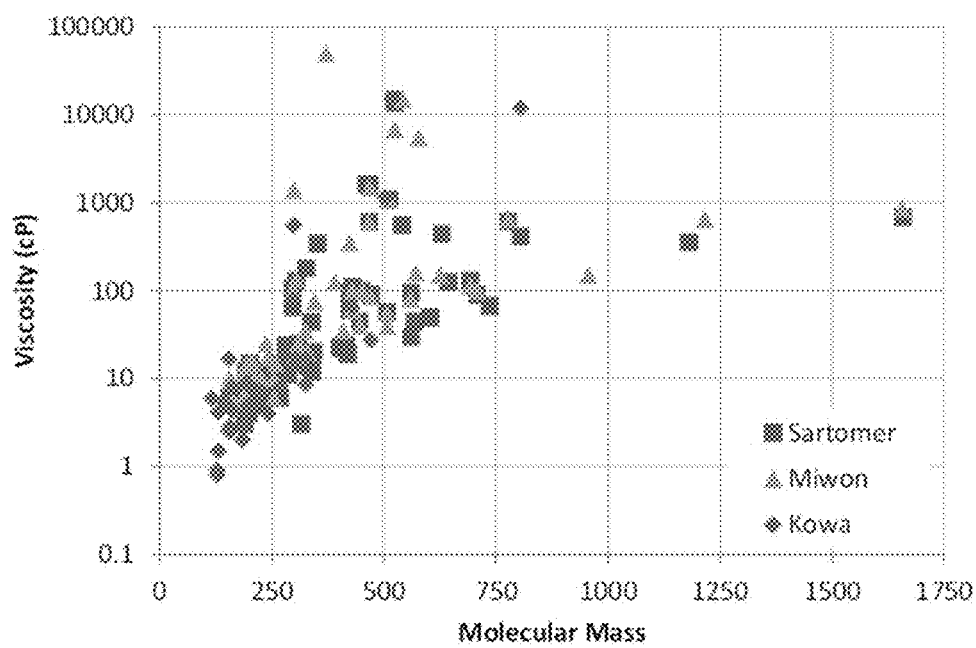
FIG. 21 shows viscosity versus molecular mass for meth (acrylate) monomers.

FIG. 21 shows a plot of viscosity at about 25° C. versus molecular mass for over 175 commercially available (meth) acrylate monomers from Sartomer Americas, Miwon Specialty Chemical Co., Ltd., and Kowa American Corporation. Although monomers of a given molecular mass demonstrate a wide range of viscosities, there is a noticeable trend of the minimum viscosities versus molecular mass. For monomers having a viscosity of at most about 100 cP, the corresponding molecular mass is at most about 750. For monomers having a viscosity of at most about 200 cP, the corresponding molecular mass is at most about 1000. For monomers having a viscosity of at most about 500 cP, the corresponding molecular mass is at most about 1250

A number of embodiments have been described. Nevertheless, it will be understood that various modifications may be made without departing from the spirit and scope of the disclosure. Accordingly, other embodiments are within the scope of the following claims.

What is claimed is:

1. A nanoimprint lithography method comprising:
    coating a surface of a nanoimprint lithography substrate with a pretreatment composition to yield a layer of the pretreatment composition on the surface of the nanoimprint lithography substrate, wherein the pretreatment composition is a liquid comprising a polymerizable component having a molecular mass between about 300 and about 750;
    disposing an imprint resist on the layer of the pretreatment composition to yield a composite layer on the surface of the nanoimprint lithography substrate, wherein the imprint resist is a polymerizable composition, the composite layer comprises a mixture of the pretreatment composition and the imprint resist, and an average spreading rate of the imprint resist on the pretreatment composition to form the composite layer exceeds an average spreading rate of the imprint resist disposed directly on the nanoimprint lithography substrate under otherwise identical conditions;
    contacting the composite layer with a nanoimprint lithography template; and
    forming a polymeric layer on the surface of the nanoimprint lithography substrate by polymerizing the composite layer, wherein polymerizing the composite layer comprises forming a covalent bond between the polymerizable component of the pretreatment composition and a component of the imprint resist.

2. The method of claim 1, wherein the pretreatment composition is substantially free of a polymerization initiator.

3. The method of claim 1, wherein the polymerizable component comprises a (meth)acrylate monomer.

4. The method of claim 3, wherein the (meth)acrylate monomer comprises at least one glycol unit.

5. The method of claim 4, wherein the at least one glycol unit is an ethylene glycol unit (EO or OCH$_2$CH$_2$O) or a propylene glycol unit (PO or —OCHCH$_3$CH$_2$O—).

6. The method of claim 1, wherein the polymerizable component comprises at least one of tripropylene glycol diacrylate, tetraethylene glycol diacrylate, poly(ethylene glycol) diacrylate, tricyclodecane dimethanol diacrylate, stearyl acrylate, iso-stearyl acrylate, alkoxylated 1,6-hexanediol diacrylate, phenol tetraethylene glycol acrylate, neopentylglycol dipropylene glycol diacrylate, 1,12-dodecanediol dimethacrylate, 1,3-bis((2-hydroxyethoxy)methyl) benzene diacrylate, 4-hexylresorcinol diacrylate, 1,4-bis((2-hydroxyethoxy)methyl)cyclohexane diacrylate, 1,3-bis((2-hydroxyethoxy)methyl)-cyclohexane diacrylate, 3-benzyloxy-1,2-propanediol (EO)$_n$ diacrylate (n=1-6), 2-phenyl-1,3-propanediol (EO)$_2$ diacrylate, 4-benzyloxy-1,3-butanediol diacrylate, 4-benzyloxy-1,3-butanediol (EO)$_2$ diacrylate, trimethylolpropane trimethacrylate, caprolactone acrylate, pentaerythritol tetraacrylate, alkoxylated pentaerythritol tetraacrylate, alkoxylated nonyl phenol acrylate, methoxy polyethylene glycol monoacrylates, alkoxylated lauryl acrylate, propoxylated (3) glyceryl triacrylate, alkoxylated trimethylolpropane triacrylate, ethoxylated bisphenol A diacrylate, ditrimethylolpropane tetraacrylate, dipentaerythritol pentaacrylate, and dipentaerythritol hexaacrylate.

7. The method of claim 6, wherein the polymerizable component comprises at least one of monomers:
    1,3-bis((2-hydroxyethoxy)methyl)benzene diacrylate;
    4-hexylresorcinol diacrylate;
    3-benzyloxy-1,2-propanediol (EO)$_1$ diacrylate;
    2-phenyl-1,3-propanediol (EO)$_2$ diacrylate;
    4-benzyloxy-1,3-butanediol diacrylate; and
    4-benzyloxy-1,3-butanediol (EO)$_2$ diacrylate.

8. The method of claim 1, wherein an interfacial surface energy between the polymerizable component and air is at least 35 mN/m.

9. The method of claim 8, wherein the interfacial surface energy between the polymerizable component and air is 45 mN/m or less.

10. The method of claim 1, wherein the difference between an interfacial surface energy between the pretreatment composition and air and between the imprint resist and air is in a range of 0.5 mN/m to 25 mN/m.

11. The method of claim 10, wherein the interfacial surface energy between the imprint resist and air is in a range of 20 mN/m to 60 mN/m.

12. The method of claim 1, wherein a viscosity of the pretreatment composition in a range between 1 cP and 150 cP at 23° C.

13. The method of claim 12, wherein the viscosity of the pretreatment composition is in a range between 1 cP and 100 cP at 23° C.

14. A method for manufacturing an article, the method comprising:
    coating a surface of a nanoimprint lithography substrate with a pretreatment composition to yield a layer of the pretreatment composition on the surface of the nanoimprint lithography substrate, wherein the pretreatment composition is a liquid comprising a polymerizable component having a molecular mass between about 300 and about 750;
    disposing an imprint resist on the layer of the pretreatment composition to yield a composite layer on the surface of the nanoimprint lithography substrate, wherein the imprint resist is a polymerizable composition, the composite layer comprises a mixture of the pretreatment composition and the imprint resist, and an average spreading rate of the imprint resist on the pretreatment composition to form the composite layer exceeds an average spreading rate of the imprint resist disposed directly on the nanoimprint lithography substrate under otherwise identical conditions;
    contacting the composite layer with a nanoimprint lithography template; and
    forming a polymeric layer on the surface of the nanoimprint lithography substrate to yield the article, wherein forming the polymeric layer comprises polymerizing the composite layer, and polymerizing the composite layer comprises forming a covalent bond between the polymerizable component of the pretreatment composition and a component of the imprint resist.

15. The method of claim 14, wherein the article comprises a processed nanoimprint lithography substrate or an optical component.

16. The article of claim 15.

17. A kit comprising:
a pretreatment composition comprising a polymerizable component having a molecular mass between about 300 and about 750; and
an imprint resist,
wherein the imprint resist is a polymerizable composition, an average spreading rate of the imprint resist on the pretreatment composition to form a composite layer exceeds an average spreading rate of the imprint resist disposed directly on a nanoimprint lithography substrate under otherwise identical conditions, and polymerizing a liquid mixture of the pretreatment composition and the imprint resist forms a covalent bond between the polymerizable component of the pretreatment composition and a component of the imprint resist.

18. The kit of claim 17, wherein the polymerizable component comprises a (meth)acrylate monomer.

19. The kit of claim 18, wherein the polymerizable component comprises at least one of monomers:
1,3-bis((2-hydroxyethoxy)methyl)benzene diacrylate;
4-hexylresorcinol diacrylate;
3-benzyloxy-1,2-propanediol $(EO)_1$ diacrylate;
2-phenyl-1,3-propanediol $(EO)_2$ diacrylate;
4-benzyloxy-1,3-butanediol diacrylate; and
4-benzyloxy-1,3-butanediol $(EO)_2$ diacrylate.

20. A pretreatment composition for a nanoimprint lithography substrate, the pretreatment composition comprising at least one of monomers:
1,3-bis((2-hydroxyethoxy)methyl)benzene diacrylate;
4-hexylresorcinol diacrylate;
3-benzyloxy-1,2-propanediol $(EO)_1$ diacrylate;
2-phenyl-1,3-propanediol $(EO)_2$ diacrylate;
4-benzyloxy-1,3-butanediol diacrylate; and
4-benzyloxy-1,3-butanediol $(EO)_2$ diacrylate.

* * * * *